United States Patent
Hsu et al.

(10) Patent No.: US 11,901,019 B2
(45) Date of Patent: *Feb. 13, 2024

(54) USE OF DATA LATCHES FOR COMPRESSION OF SOFT BIT DATA IN NON-VOLATILE MEMORIES

(71) Applicant: SANDISK TECHNOLOGIES LLC, Addison, TX (US)

(72) Inventors: Hua-Ling Cynthia Hsu, Milpitas, CA (US); Masaaki Higashitani, Cupertino, CA (US); YenLung Li, San Jose, CA (US); Chen Chen, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/666,657

(22) Filed: Feb. 8, 2022

(65) Prior Publication Data

US 2023/0081623 A1 Mar. 16, 2023

Related U.S. Application Data

(63) Continuation-in-part of application No. 17/557,236, filed on Dec. 21, 2021.
(Continued)

(51) Int. Cl.
*G11C 16/26* (2006.01)
*G11C 16/24* (2006.01)
(Continued)

(52) U.S. Cl.
CPC .......... *G11C 16/26* (2013.01); *G11C 16/0483* (2013.01); *G11C 16/24* (2013.01); *H03M 13/1111* (2013.01); *H03M 13/611* (2013.01)

(58) Field of Classification Search
None
See application file for complete search history.

(56) References Cited

U.S. PATENT DOCUMENTS 5,341,382 A * 8/1994 Levitt ............... G06F 11/2236
714/724
8,456,919 B1 6/2013 Jeon et al.
(Continued)

FOREIGN PATENT DOCUMENTS

CN 107393595 A * 11/2017 .......... G11C 11/406

OTHER PUBLICATIONS

U.S. Appl. No. 17/359,945, filed Jun. 28, 2021.
(Continued)

*Primary Examiner* — Guerrier Merant
(74) *Attorney, Agent, or Firm* — Vierra Magen Marcus LLP

(57) ABSTRACT

For a non-volatile memory that uses hard bit and soft bit data in error correction operations, to reduce the amount of soft bit data that needs to be transferred from a memory to the controller and improve memory system performance, the soft bit data can be compressed before transfer. After the soft bit data is read and stored into the internal data latches associated with the sense amplifiers, it is compressed within these internal data latches. The compressed soft bit data can then be transferred to the transfer data latches of a cache buffer, where the compressed soft bit data can be consolidated and transferred out over an input-output interface. Within the input-output interface, the compressed data can be reshuffled to put into logical user data order if needed.

20 Claims, 32 Drawing Sheets

Related U.S. Application Data

(60) Provisional application No. 63/244,951, filed on Sep. 16, 2021.

(51) Int. Cl.
    *H03M 13/00*     (2006.01)
    *H03M 13/11*     (2006.01)
    *G11C 16/04*     (2006.01)

(56) References Cited

U.S. PATENT DOCUMENTS

| | | |
|---|---|---|
| 8,874,994 B2 | 10/2014 | Sharon et al. |
| 9,484,089 B2 | 11/2016 | Bazarsky et al. |
| 9,558,836 B2 * | 1/2017 | Mui ................ G11C 16/26 |
| 9,978,462 B2 | 5/2018 | Ravimohan et al. |
| 10,768,855 B1 | 9/2020 | Hsiao |
| 11,443,821 B2 * | 9/2022 | Mondello ............ G11C 29/32 |
| 2008/0285685 A1 | 11/2008 | Chang et al. |
| 2014/0071761 A1 | 3/2014 | Sharon et al. |
| 2014/0185377 A1 | 7/2014 | Kim et al. |
| 2014/0237315 A1 | 8/2014 | Fitzpatrick et al. |
| 2015/0303948 A1 | 10/2015 | Yoon et al. |
| 2016/0093373 A1 | 3/2016 | Siau et al. |
| 2016/0099070 A1 | 4/2016 | Jiang et al. |
| 2016/0179404 A1 | 6/2016 | Nanduri et al. |
| 2017/0046220 A1 | 2/2017 | Sharon et al. |
| 2017/0255512 A1 | 9/2017 | Zamir et al. |
| 2018/0012636 A1 * | 1/2018 | Alzheimer ............ G11C 7/22 |
| 2018/0197967 A1 | 7/2018 | Oh et al. |
| 2018/0349029 A1 | 12/2018 | Mohammadzadeh et al. |
| 2019/0068222 A1 | 2/2019 | Lee |
| 2019/0385683 A1 | 12/2019 | Yamada |
| 2020/0090761 A1 | 3/2020 | Ando et al. |
| 2021/0217476 A1 * | 7/2021 | Shirakawa ............ G11C 16/10 |
| 2021/0327530 A1 * | 10/2021 | Yun .................... H03M 13/1111 |
| 2022/0044737 A1 * | 2/2022 | Khayat ................ G11C 11/5642 |
| 2022/0116053 A1 | 4/2022 | Zamir et al. |
| 2022/0180957 A1 * | 6/2022 | Yang .................... G11C 7/106 |
| 2022/0199188 A1 | 6/2022 | Varadarajan et al. |
| 2022/0269513 A1 * | 8/2022 | Su ........................ G06F 3/0604 |

OTHER PUBLICATIONS

U.S. Appl. No. 17/557,428, filed Dec. 21, 2021.
U.S. Appl. No. 17/557,433, filed Dec. 21, 2021.
U.S. Appl. No. 17/557,236, filed Dec. 21, 2021.
U.S. Appl. No. 17/731,961, filed Apr. 28, 2022.
U.S. Appl. No. 17/742,982, filed May 12, 2022.
U.S. Appl. No. 17/731,971, filed Apr. 28, 2022.
Non-final Office Action dated Aug. 16, 2023, U.S. Appl. No. 17/557,433, filed Dec. 21, 2021.
Response to Office Action dated Sep. 13, 2023, U.S. Appl. No. 17/731,971, filed Apr. 28, 2022.
Response to Non-final Office Action dated Sep. 15, 2023, U.S. Appl. No. 17/557,236, filed Dec. 21, 2021.
Response to Office Action dated Nov. 13, 2023, U.S. Appl. No. 17/557,433, filed Dec. 21, 2021.
Notice of Allowance dated May 16, 2023, U.S. Appl. No. 17/731,961, filed Apr. 28, 2022.
Non-final Office Action dated May 18, 2023, U.S. Appl. No. 17/557,236, filed Dec. 21, 2021.
Non-final Office Action dated Jun. 22, 2023, U.S. Appl. No. 17/731,971, filed Apr. 28, 2022.
Non-final Office Action dated Sep. 26, 2023, U.S. Appl. No. 17/557,428, filed Dec. 21, 2023.
Notice of Allowance dated Oct. 18, 2023, U.S. Appl. No. 17/731,971, filed Apr. 28, 2022.

* cited by examiner

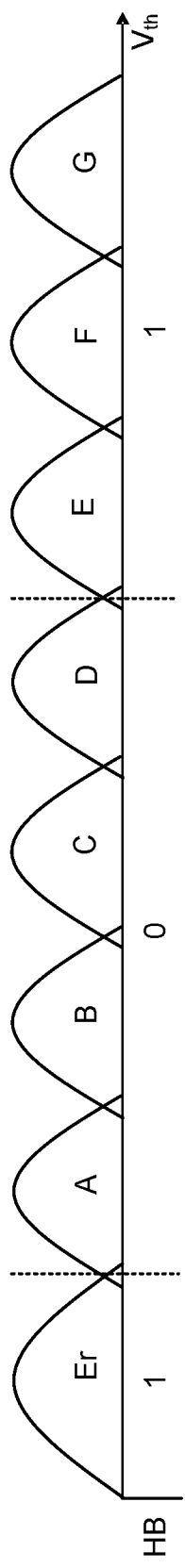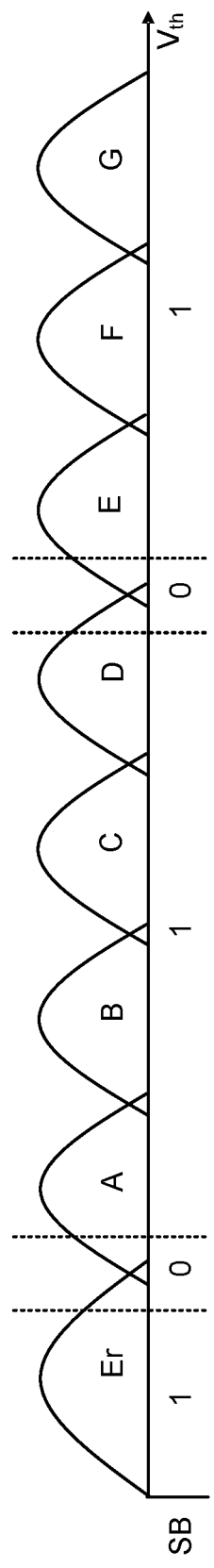

| | | | | |
|---|---|---|---|---|
| W0 | W0<3:0> | W288<7:4> | W576<11:8> | W864<15:12> |
| W1 | W1<3:0> | W289<7:4> | W577<11:8> | W865<15:12> |
| W2 | W2<3:0> | W290<7:4> | W578<11:8> | W866<15:12> |
| W3 | W3<3:0> | W291<7:4> | W579<11:8> | W867<15:12> |
| W4 | W4<3:0> | W292<7:4> | W580<11:8> | W868<15:12> |
| W5 | W5<3:0> | W293<7:4> | W581<11:8> | W869<15:12> |
| W6 | W6<3:0> | W294<7:4> | W582<11:8> | W870<15:12> |
| W7 | W7<3:0> | W295<7:4> | W583<11:8> | W871<15:12> |
| W8 | W8<3:0> | W296<7:4> | W584<11:8> | W872<15:12> |
| ... | | | | |
| W15 | W15<3:0> | W303<7:4> | W591<11:8> | W879<15:12> |

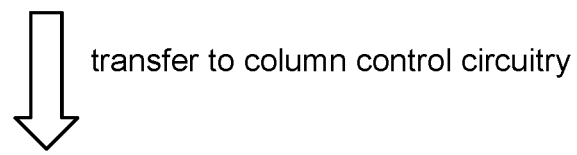

transfer to column control circuitry

| | | | | |
|---|---|---|---|---|
| IOBUS0A | W0<3:0> | W16<3:0> | W32<3:0> | W48<3:0> |
| IOBUS0B | W8<3:0> | W24<3:0> | W40<3:0> | W56<3:0> |
| IOBUS1A | W1<3:0> | W17<3:0> | W33<3:0> | W49<3:0> |
| IOBUS1B | W9<3:0> | W25<3:0> | W41<3:0> | W57<3:0> |
| IOBUS2A | W2<3:0> | W18<3:0> | W34<3:0> | W50<3:0> |
| IOBUS2B | W10<3:0> | W26<3:0> | W42<3:0> | W58<3:0> |
| IOBUS3A | W3<3:0> | W19<3:0> | W35<3:0> | W51<3:0> |
| IOBUS3B | W11<3:0> | W27<3:0> | W43<3:0> | W59<3:0> |
| IOBUS4A | W4<3:0> | W20<3:0> | W36<3:0> | W52<3:0> |
| IOBUS4B | W12<3:0> | W28<3:0> | W44<3:0> | W60<3:0> |
| IOBUS5A | W5<3:0> | W21<3:0> | W37<3:0> | W53<3:0> |
| IOBUS5B | W13<3:0> | W29<3:0> | W45<3:0> | W61<3:0> |
| IOBUS6A | W6<3:0> | W22<3:0> | W38<3:0> | W54<3:0> |
| IOBUS6B | W14<3:0> | W30<3:0> | W46<3:0> | W62<3:0> |
| IOBUS7A | W7<3:0> | W23<3:0> | W39<3:0> | W55<3:0> |
| IOBUS7B | W15<3:0> | W31<3:0> | W47<3:0> | W63<3:0> |

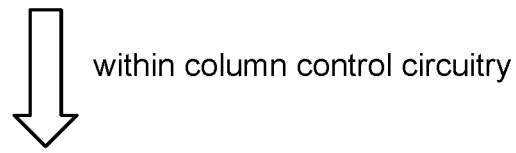

within column control circuitry

Figure 24A

| | | | | |
|---|---|---|---|---|
| W0 | W0<3:0> | W8<3:0> | W16<3:0> | W24<3:0> |
| W1 | W1<3:0> | W9<3:0> | W17<3:0> | W25<3:0> |
| W2 | W2<3:0> | W10<3:0> | W18<3:0> | W26<3:0> |
| W3 | W3<3:0> | W11<3:0> | W19<3:0> | W27<3:0> |
| W4 | W4<3:0> | W12<3:0> | W20<3:0> | W28<3:0> |
| W5 | W5<3:0> | W13<3:0> | W21<3:0> | W29<3:0> |
| W6 | W6<3:0> | W14<3:0> | W22<3:0> | W30<3:0> |
| W7 | W7<3:0> | W15<3:0> | W23<3:0> | W31<3:0> |
| W8 | W32<3:0> | W40<3:0> | W48<3:0> | W56<3:0> |
| ... | | | | |
| W15 | W39<3:0> | W47<3:0> | W55<3:0> | W63<3:0> | transfer over global data bus

| | | | | |
|---|---|---|---|---|
| W0 | W0<3:0> | W1<3:0> | W2<3:0> | W3<3:0> |
| W1 | W4<3:0> | W5<3:0> | W6<3:0> | W7<3:0> |
| W2 | W8<3:0> | W9<3:0> | W10<3:0> | W11<3:0> |
| W3 | W12<3:0> | W13<3:0> | W14<3:0> | W15<3:0> |
| W4 | W16<3:0> | W17<3:0> | W18<3:0> | W19<3:0> |
| W5 | W20<3:0> | W21<3:0> | W22<3:0> | W23<3:0> |
| W6 | W24<3:0> | W25<3:0> | W26<3:0> | W27<3:0> |
| W7 | W28<3:0> | W29<3:0> | W30<3:0> | W31<3:0> |
| W8 | W32<3:0> | W33<3:0> | W34<3:0> | W35<3:0> |
| ... | | | | |
| W15 | W60<3:0> | W61<3:0> | W62<3:0> | W63<3:0> |

USE OF DATA LATCHES FOR COMPRESSION OF SOFT BIT DATA IN NON-VOLATILE MEMORIES

CLAIM OF PRIORITY

The present application is a Continuation-in-Part of U.S. patent application Ser. No. 17/557,236, entitled "Efficient sensing of Soft Bit Data for Non-Volatile Memory" by Hsu, filed Dec. 21, 2021, which it turn claims priority from U.S. Provisional Patent Application No. 63/244,951, entitled "Plane Level Vertical Compression Scheme" by Hsu, et al., filed Sep. 16, 2021, both of which are hereby incorporated by reference in their entireties.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIGS. 9A and 9B respectively illustrate the read levels for computing hard bit and soft bit values for the lower page of data in a three bits of data per memory cell embodiment.

FIGS. 18 and 19 illustrate two embodiments for the compression of the original soft bit data from one set of internal data latches to another set of data latches.

FIG. 20 illustrates a rearrangement of the compressed soft bit data within the internal data latches.

FIG. 22 is a schematic representation of the reshuffling of the compressed data bits to be in logical order.

FIGS. 24A and 24B is a schematic representation of an alternate embodiment of the reshuffling of the compressed data bits to be in logical order using the embodiment of FIG. 23.

DETAILED DESCRIPTION

Figure 1:
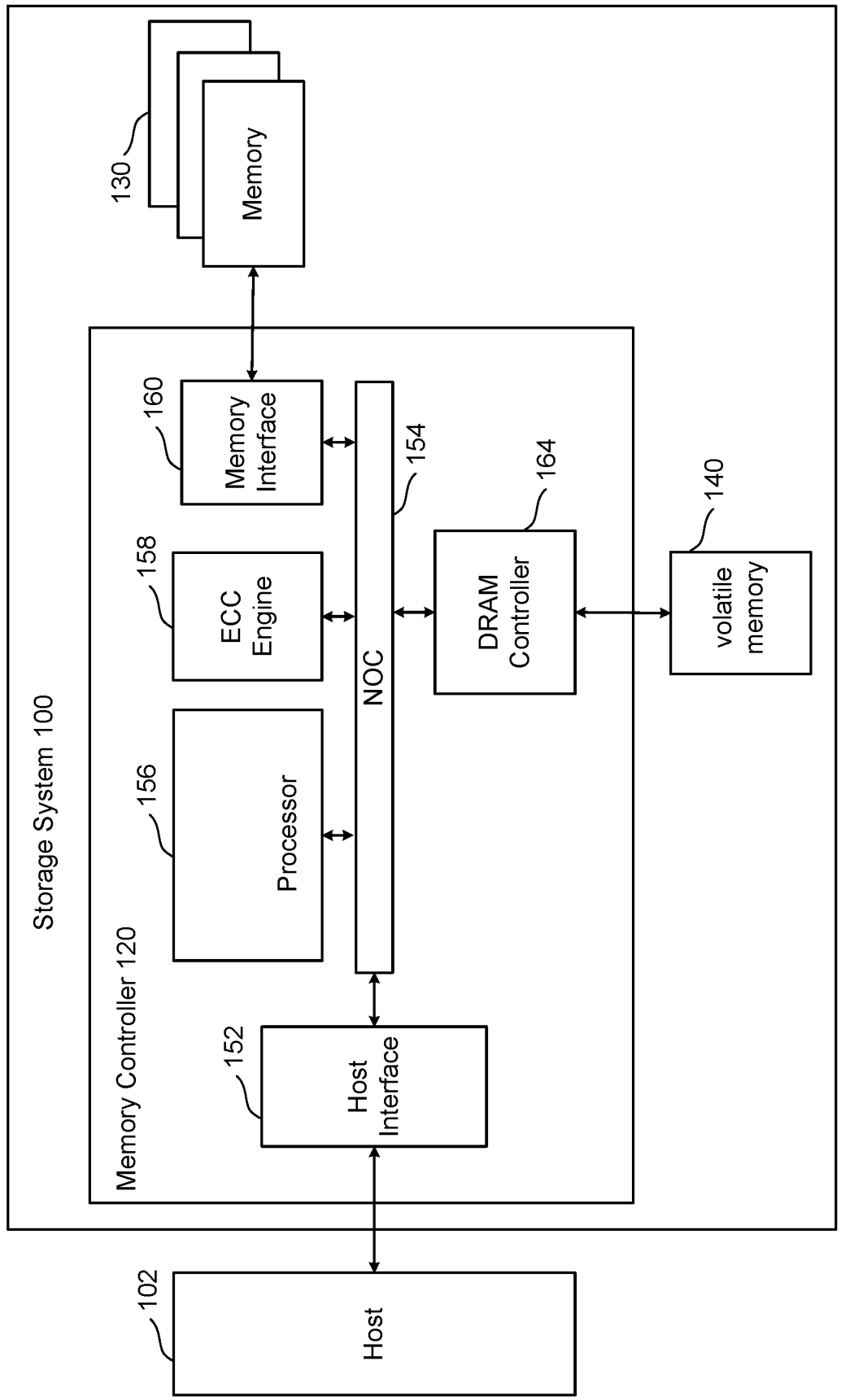
FIG. 1 is a block diagram depicting one embodiment of a storage system.

In some memory systems, error correction methods that include "soft bit" data are sometime used. Soft bit data provides information on the reliability of the standard, or "hard bit", data values used to distinguish between data states. For example, when data values are based on threshold voltages of the memory cell, a hard bit read would determine whether a memory cell's threshold voltage is above or below a data read value in order to differentiate between stored data states. For memory cells with a threshold voltage slightly above or slightly below this reference value, this hard bit may be incorrect as the memory cell is actually meant to be in the other data state. To determine memory cells having a threshold voltage near the hard bit read level, and that consequently have hard bit values of lower reliability, a pair of additional reads that are shifted somewhat above and somewhat below the hard bit read level can be performed to generate soft bit values for the hard bit values. The use of soft bits can be a powerful tool for extracting the data content of memory cells, but as it requires additional reads to obtain the soft bit data that then need to be transferred to the error correction circuitry, it is typically only used when the data cannot be determined accurately from the hard bit values alone.

The following presents an efficient soft sense read mode that requires fewer read values to generate soft bit date and generates less soft bit data, reducing the performance and power consumption loses normally associated with using soft bit data, allowing the efficient soft sense mode to be used as a default read mode. Relative to a typical hard bit, soft bit arrangement, the read point for the hard bit is shifted so that the hard bit value for one of the memory cell's data states is reliable, but the hard bit for the other data state includes a larger number of unreliable hard bit values. A single soft bit read is performed to provide reliability information for the less reliable hard bit value, but not for the more reliable hard bit value, reducing both the number of reads and amount of resultant data. To further improve performance, both the hard bit sensing and the soft bit sensing can be combined into a single sensing, such as by pre-charging a node of a sense amplifier and discharging a single time through a selected memory cell, but sensing the resultant level for the single discharge on the node twice, once for a hard bit value and once for a soft bit value.

To further reduce the amount of data that needs to be transferred from a memory to the controller and improve memory system performance, the soft bit data can be compressed before transfer. After the soft bit data is read and stored into the internal data latches associated with the sense amplifiers, it is compressed within these internal data latches. The compressed soft bit data can then be transferred to the transfer data latches of a cache buffer, where the compressed soft bit data can be consolidated and transferred out over an input-output interface. Within the input-output interface, the compressed data can be reshuffled to put into logical user data order if needed.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
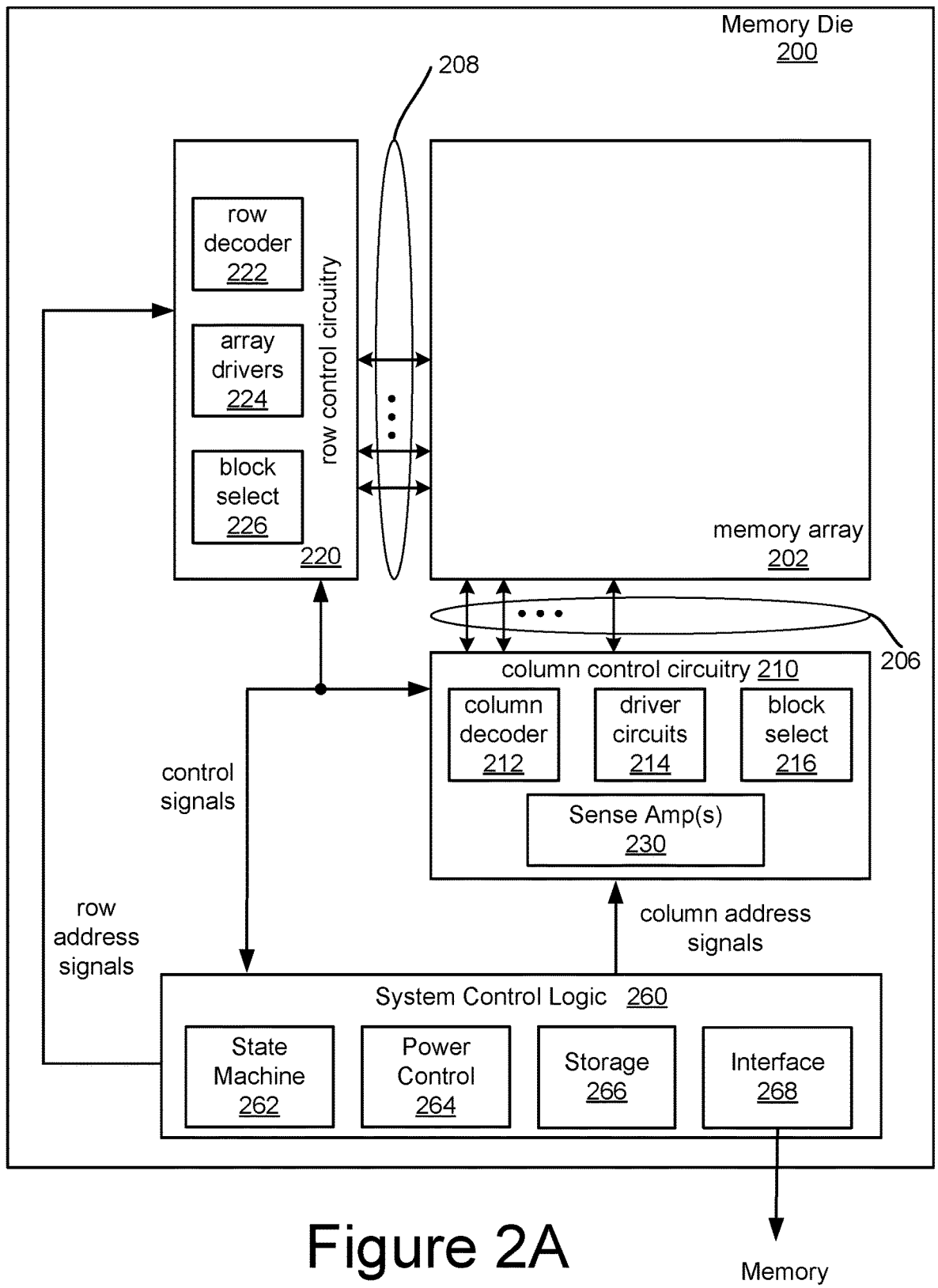
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
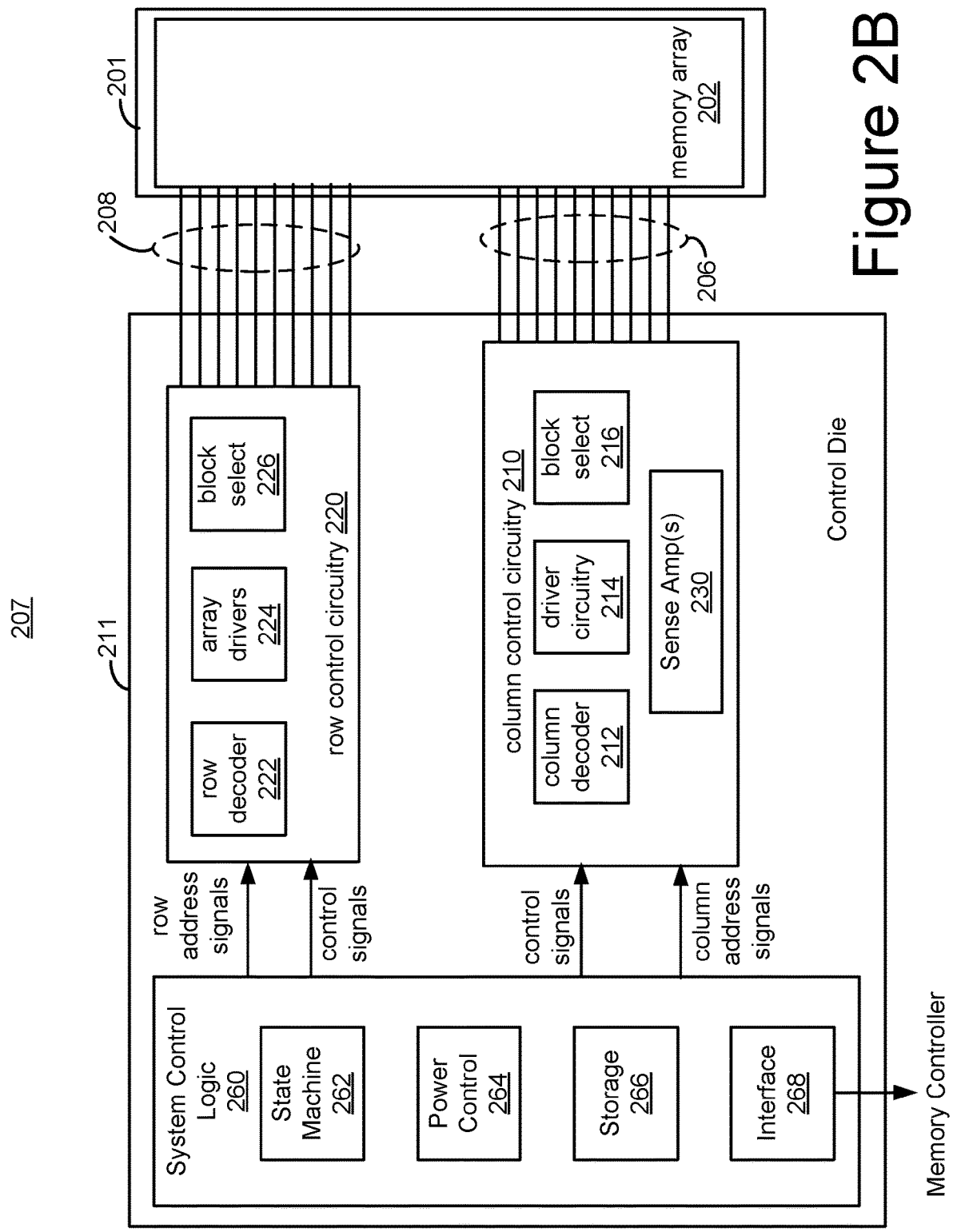
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. In some embodiments, there is more than one control die 211 and more than one memory die 201 in an integrated memory assembly 207. In some embodiments, the integrated memory assembly 207 includes a stack of multiple control die 211 and multiple memory die 201.

Figure 3:
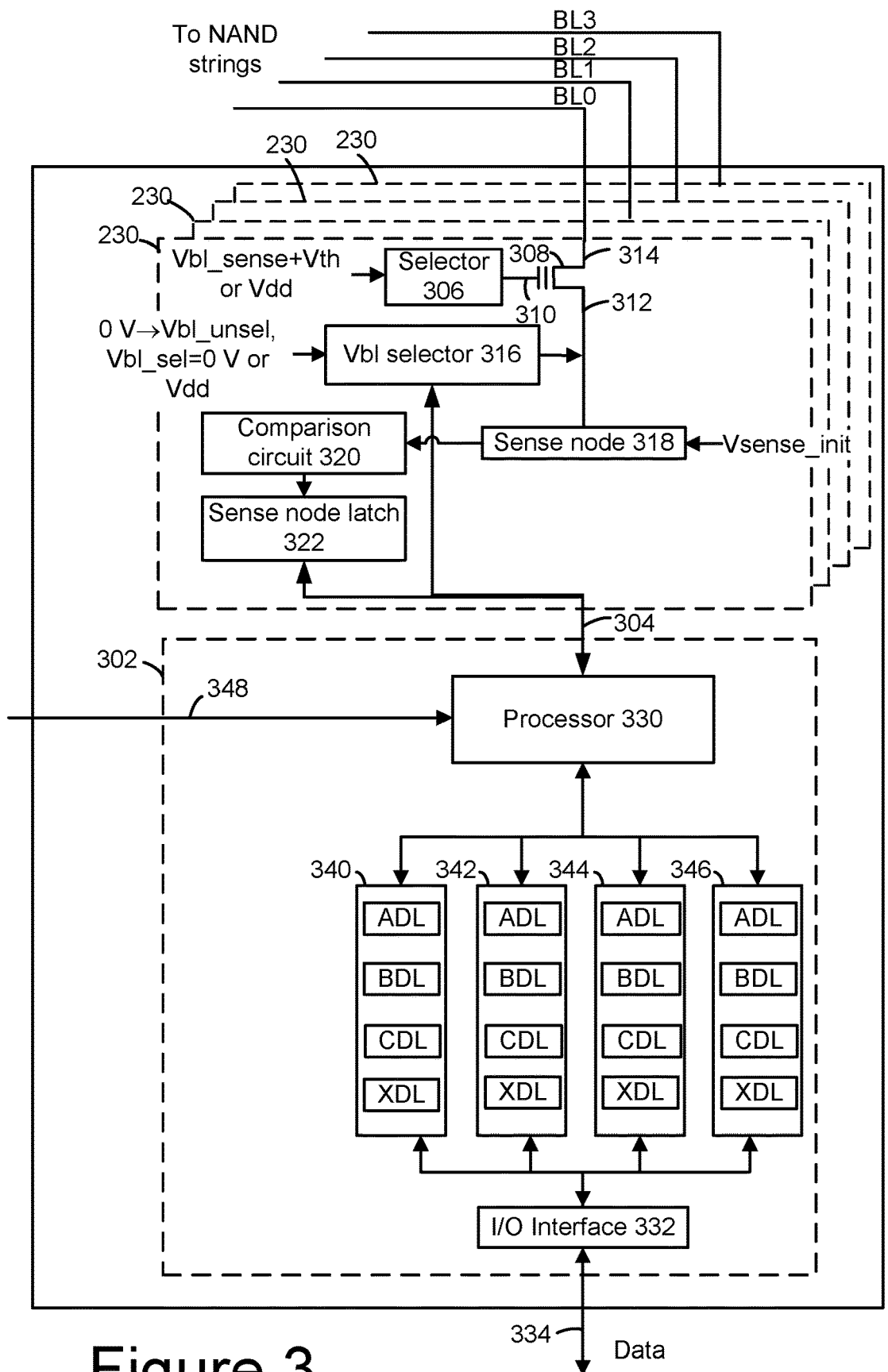
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an NMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg-Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell≤Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
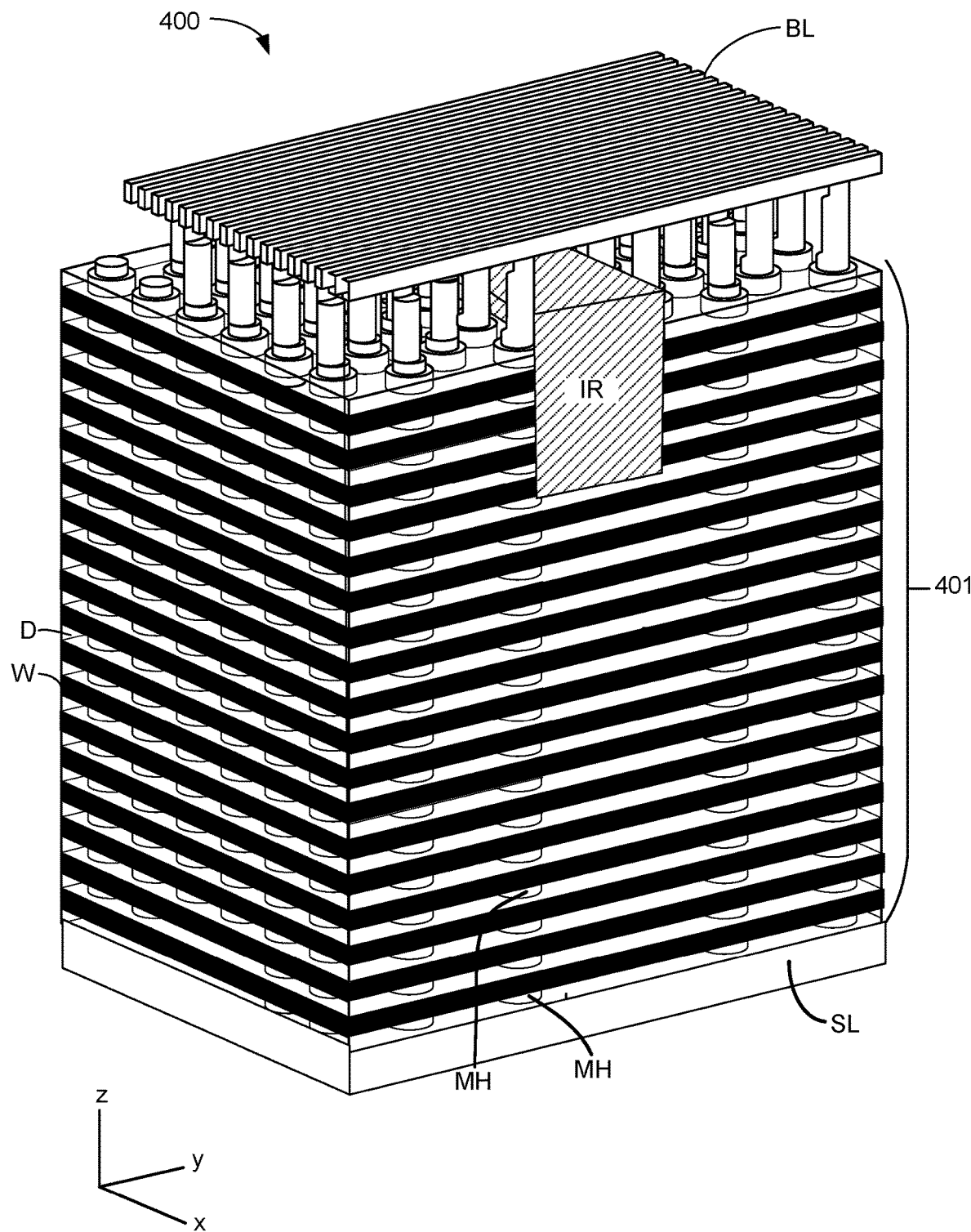
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
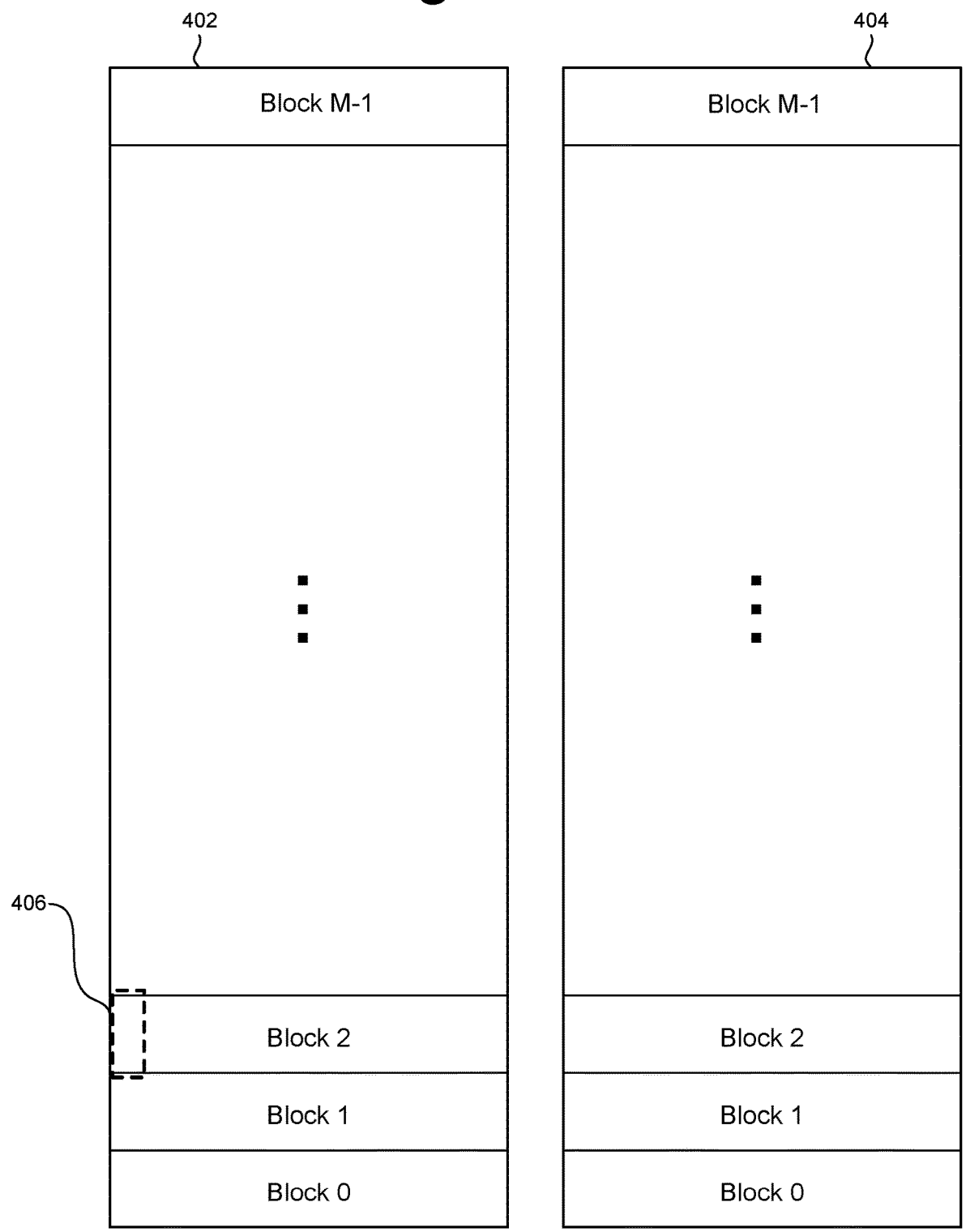
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
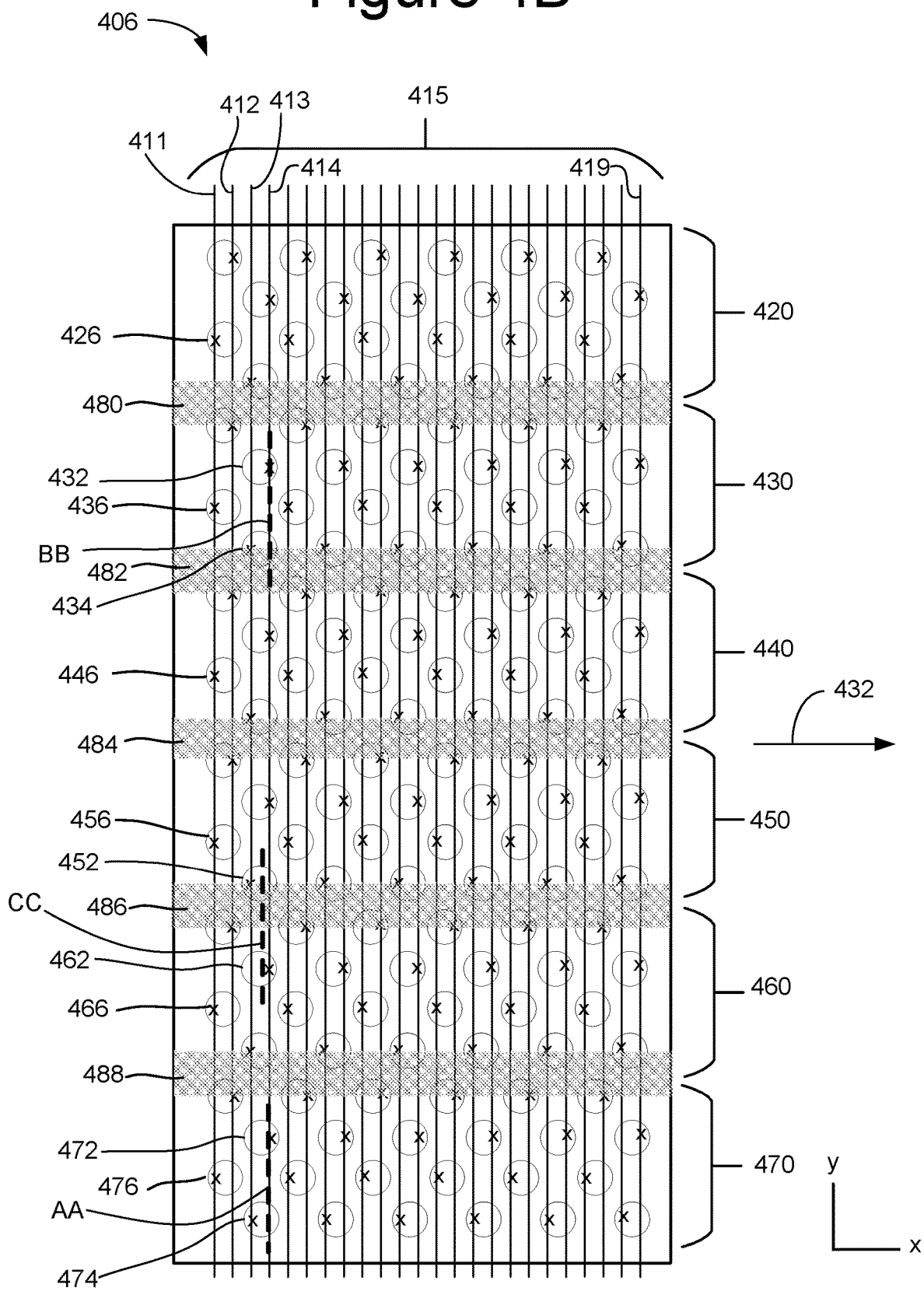
FIGS. 4B-4G more detail for the embodiment of FIG. 4.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines may be connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty-four rows of active columns and each bit line connects to six rows in each block. In one embodiment, all of the six vertical columns/NAND strings connected to a common bit line are connected to the same word line (or set of word lines). Therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
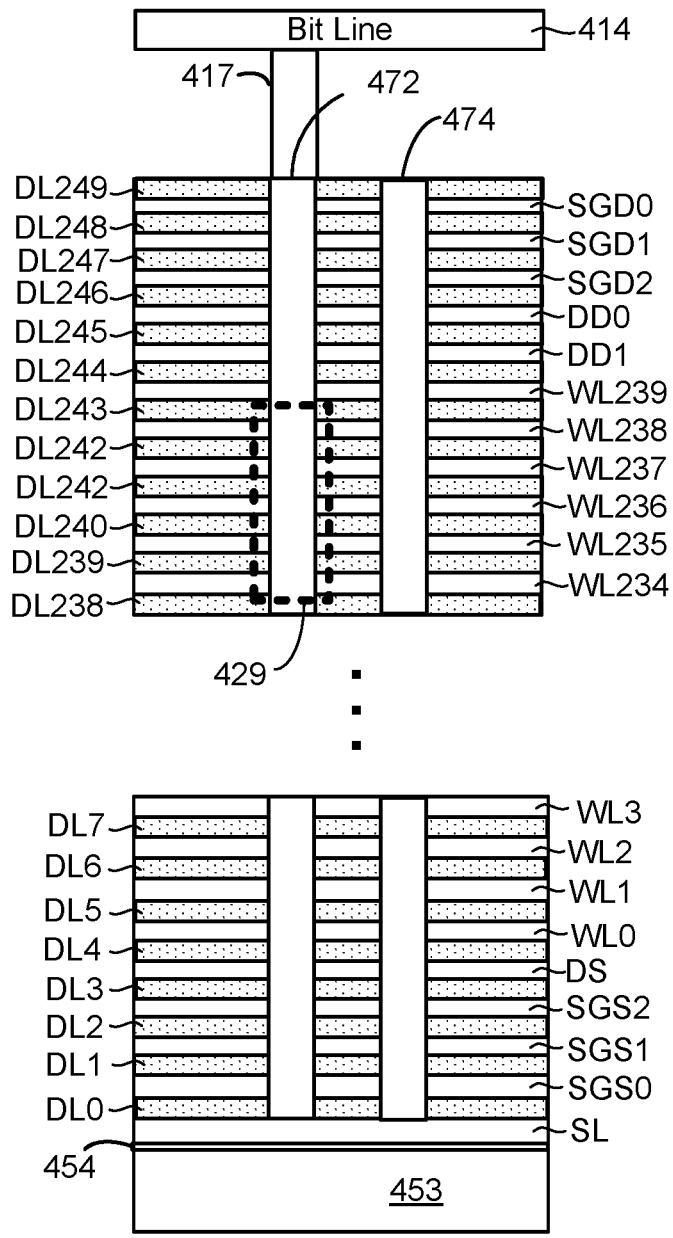

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes: three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells; and two hundred and fifty dielectric layers Dl0-DL249. Other embodiments can implement more or less than the numbers described above for FIG. 4C. In one embodiment, SGD0, SGD1 and SGD2 are connected together, and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers is substrate 453, an insulating film 454 on the substrate, and source line SL. The NAND string of vertical column 442 has a source end at a bottom of the stack and a drain end at a top of the stack. As in FIG. 4B, FIG. 4C shows vertical column 472 connected to bit line 414 via connector 417.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
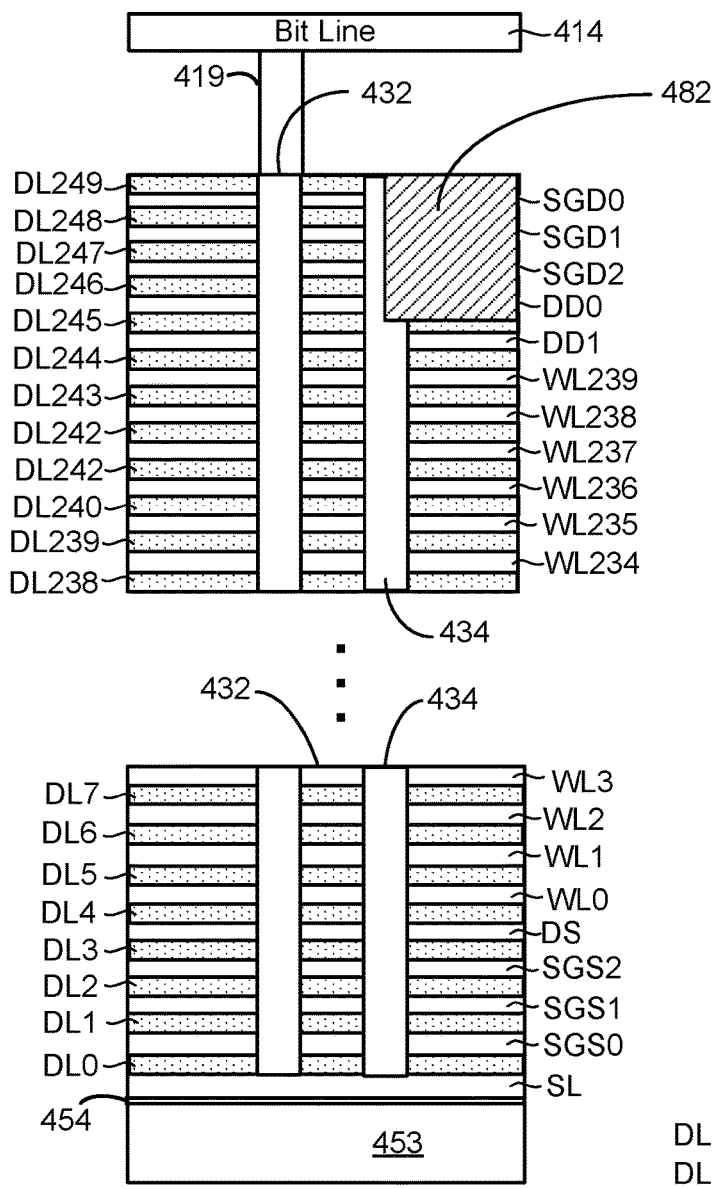

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488 occupy space that would have been used for a portion of the memory holes/vertical columns/ NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
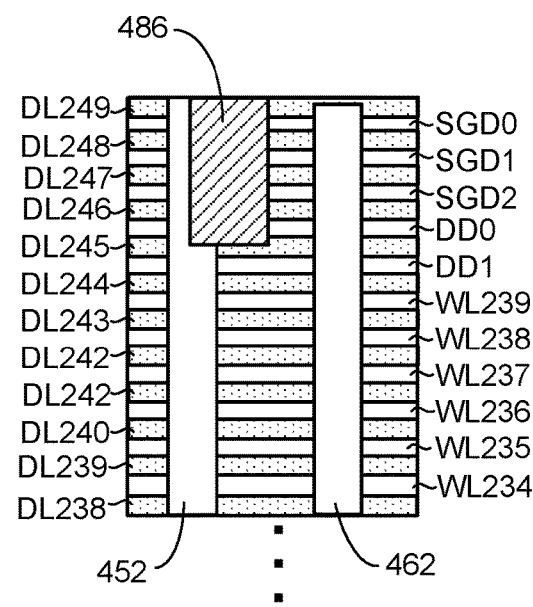

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
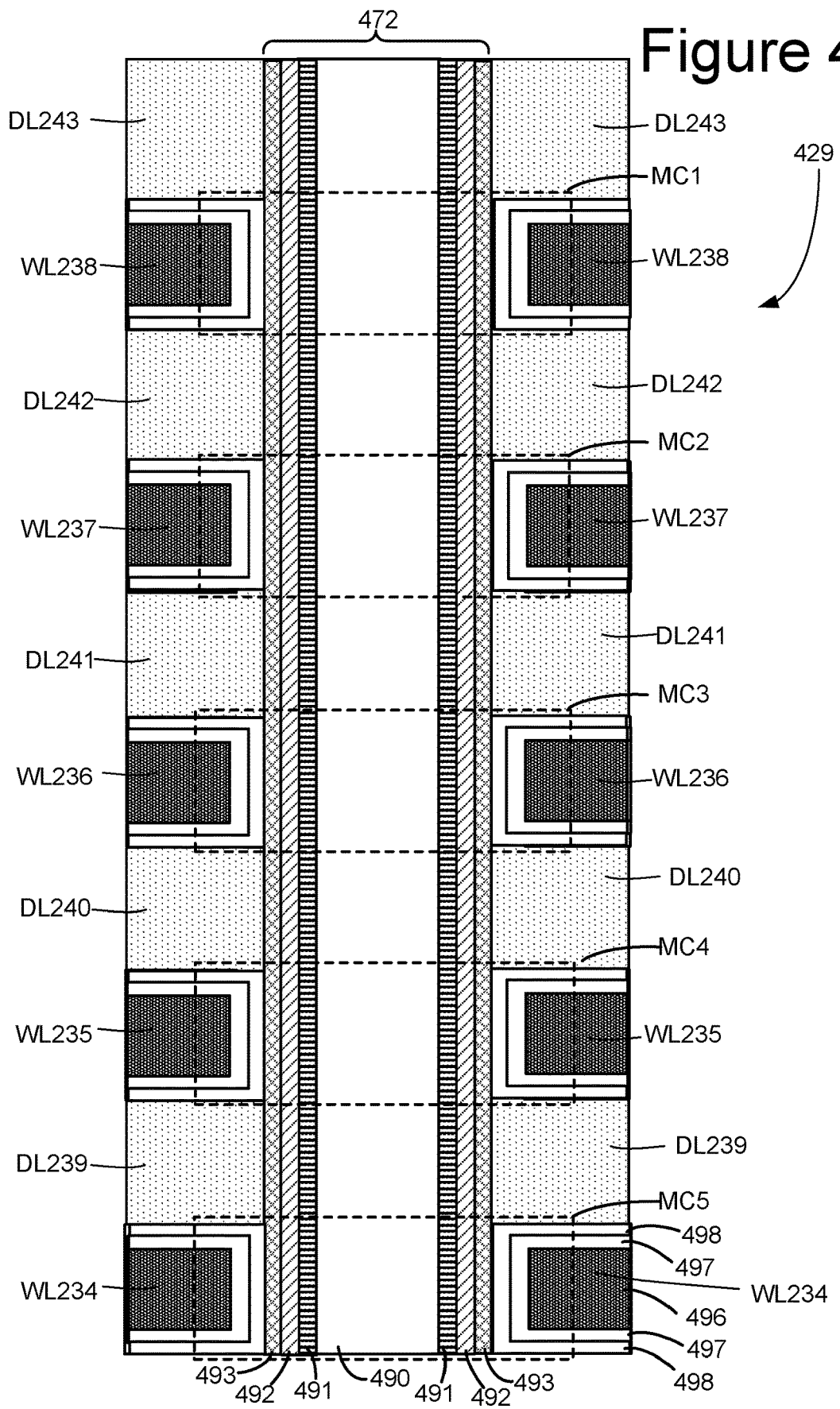

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) silicon nitride. Other memory materials and structures can also be used. The technology described herein is not limited to any particular material or structure.

FIG. 4D depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure, however, the memory cell would still be the storage unit.

When a memory cell is programmed, electrons are stored in a portion of the charge trapping layer 493 which is associated with (e.g., in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
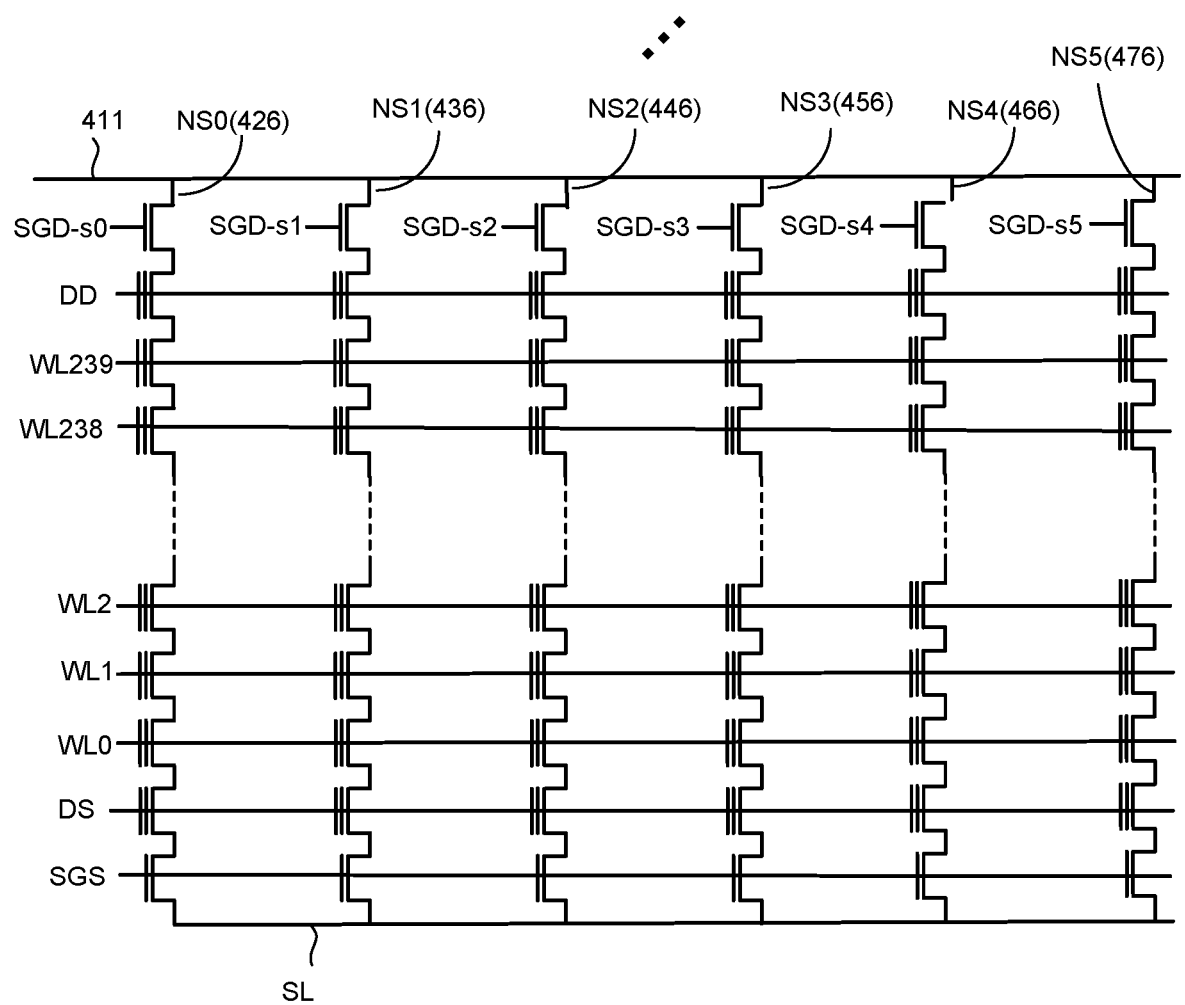

FIG. 4G is a schematic diagram of a portion of the memory array 202 depicted in in FIGS. 4-4F. FIG. 4G shows physical data word lines WL0-WL239 running across the entire block. The structure of FIG. 4G corresponds to a portion 306 in Block 2 of FIG. 4A, including bit line 411. Within the block, in one embodiment, each bit line is connected to six NAND strings. Thus, FIG. 4G shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4G only shows the NAND strings connected to bit line 411. However, a full schematic of the block would show every bit line and six vertical NAND strings connected to each bit line.

Although the example memories of FIGS. 4-4G are three dimensional memory structure that includes vertical NAND strings with charge-trapping material, other (2D and 3D) memory structures can also be used with the technology described herein.

Figure 5A:
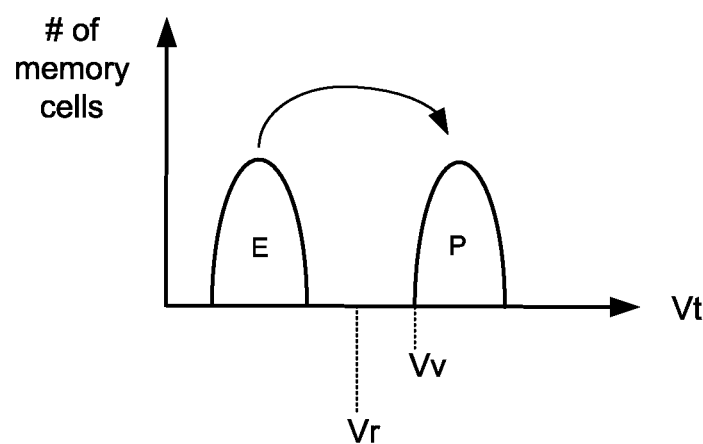
FIGS. 5A-5F depict examples of threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bits per memory cell data are referred to as multilevel cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
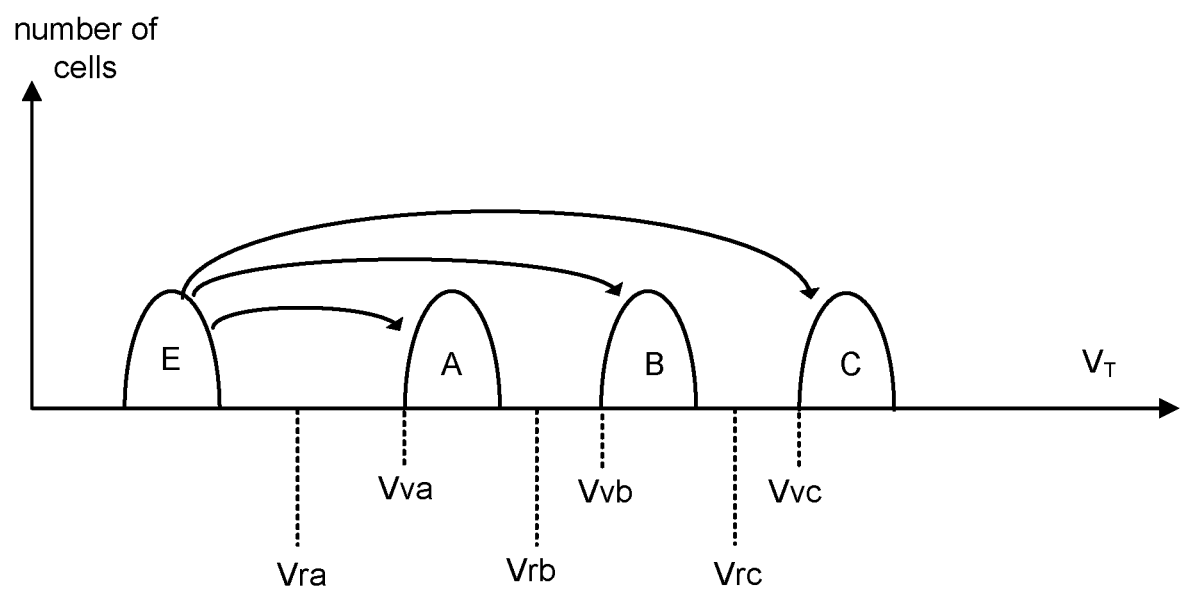

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
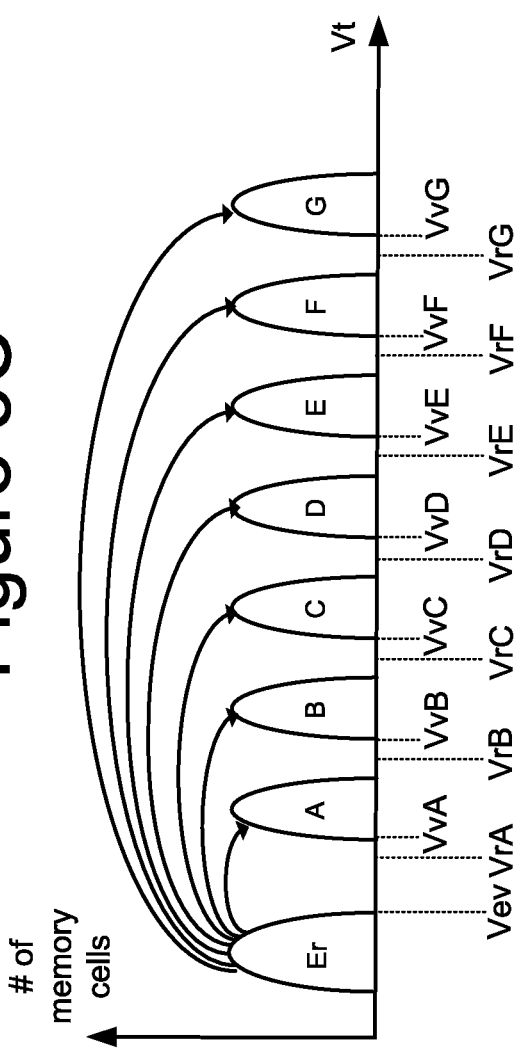

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
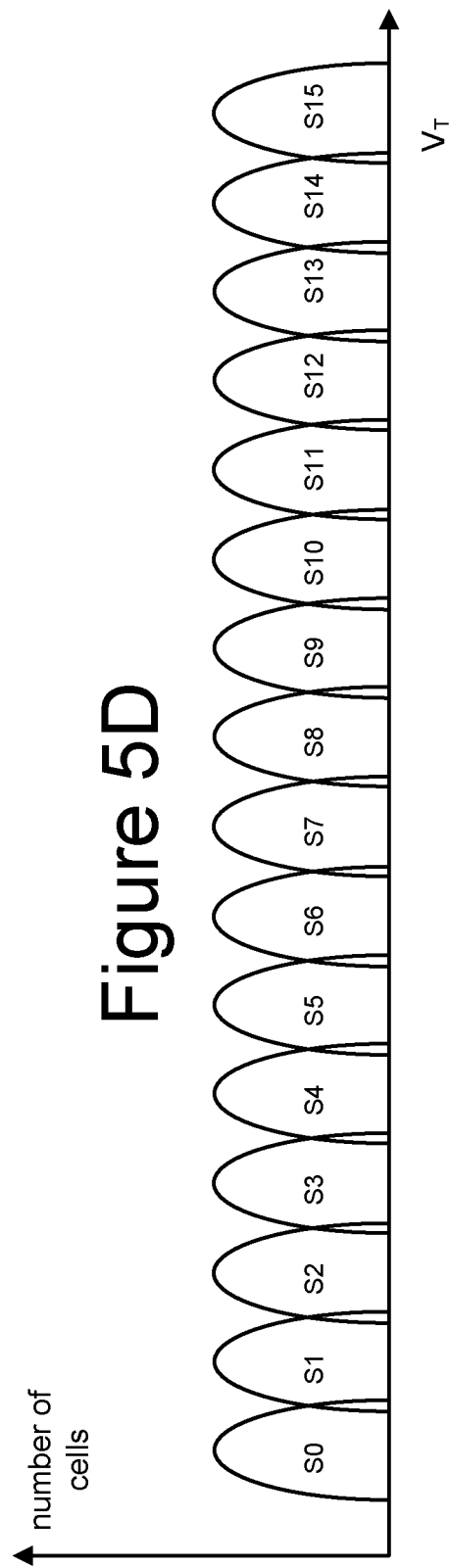
Figure 5E:
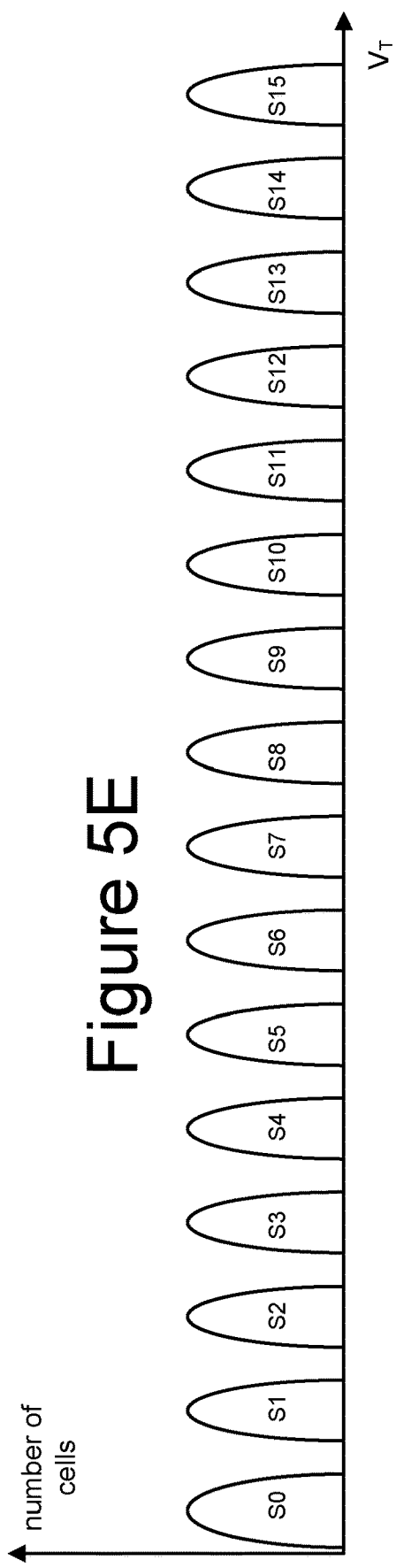

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
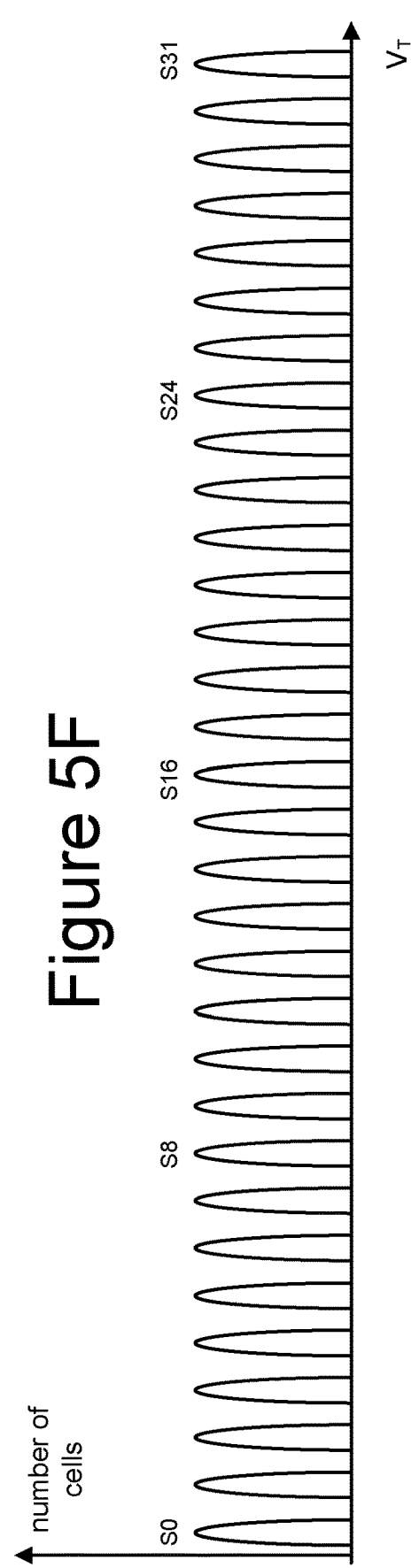

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
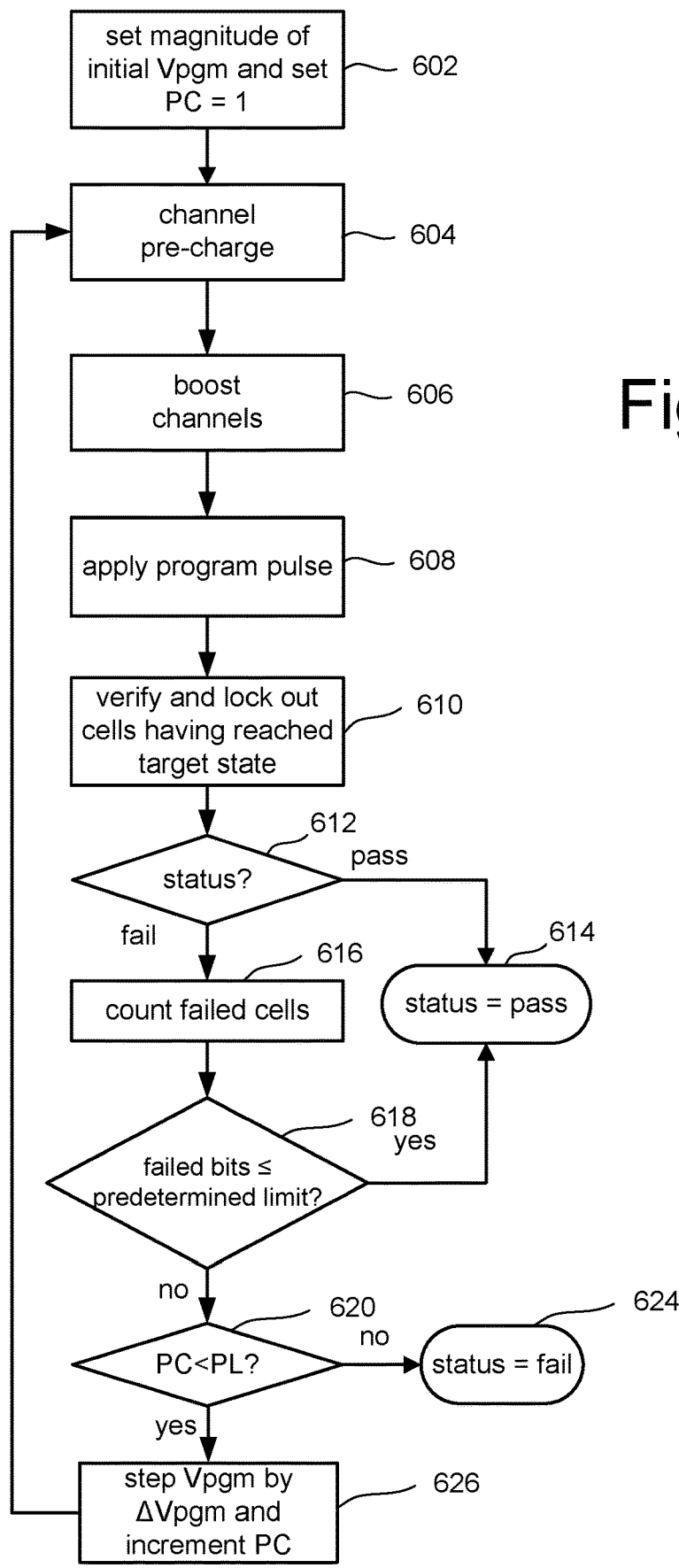
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the program counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

In some embodiments, the controller, control die or memory die perform the ECC decoding process (see ECC engine). To help fix errors that can occur when storing data, error correction is used. During the programming process, ECC engine encodes the data to add ECC information. For example, ECC engine is used to create code words. In one embodiment, data is programmed in units of pages. Because it is possible that errors can occur when programming or reading, and errors can occur while storing data (e.g., due to electrons drifting, data retention issues or other phenomenon), error correction is used with the programming of a page of data. Many error correction coding schemes are well known in the art. These conventional error correction codes (ECC) are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other embodiments, the actual data is changed.

The particular parameters for a given error correction code include the type of code, the size of the block of actual data from which the code word is derived, and the overall length of the code word after encoding. For example, a typical BCH code applied to 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the controller receives host data, also referred to as information bits, that is to be stored in a memory structure. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used which implements error correction decoding corresponding to the encoding implemented in controller 120. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios, LLRs, which are obtained from LLR tables. LLR values are measures of the reliability with which the values of various binary bits read from the storage elements are known.

The LLR for a bit is given by:

$$Q = \log_2 \frac{P(v=0 \mid Y)}{P(v=1 \mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

The controller receives the code word Y1 and the LLRs and iterates in successive iterations in which it determines if parity checks (equations) of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Figure 7:
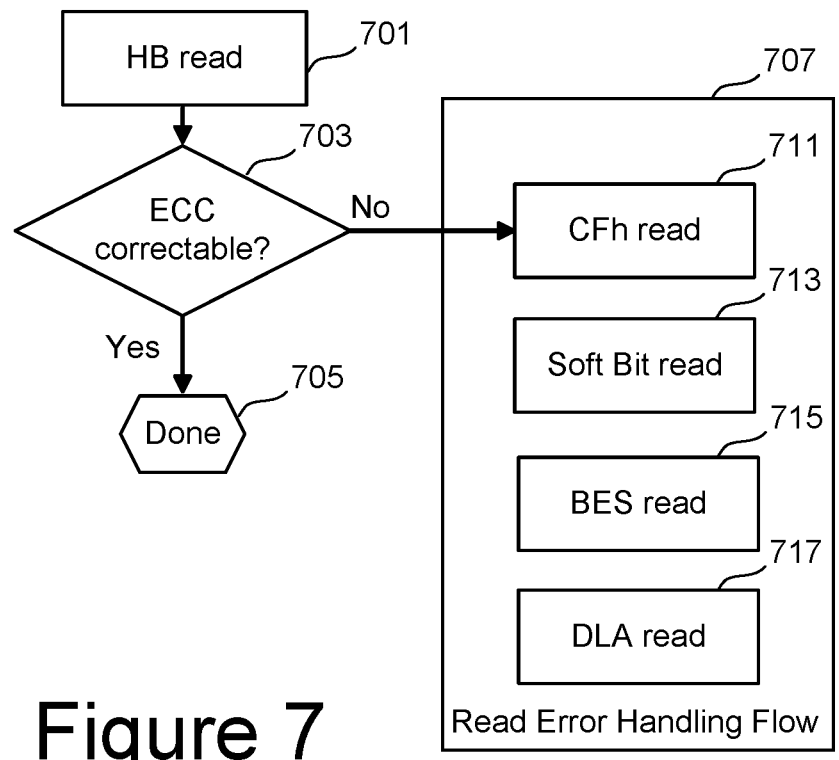
FIG. 7 illustrates the overlap of the distribution of two adjacent data states and a set of read values that can be used to determine the data state of a cell and the reliability of such a read.
Figure 8:
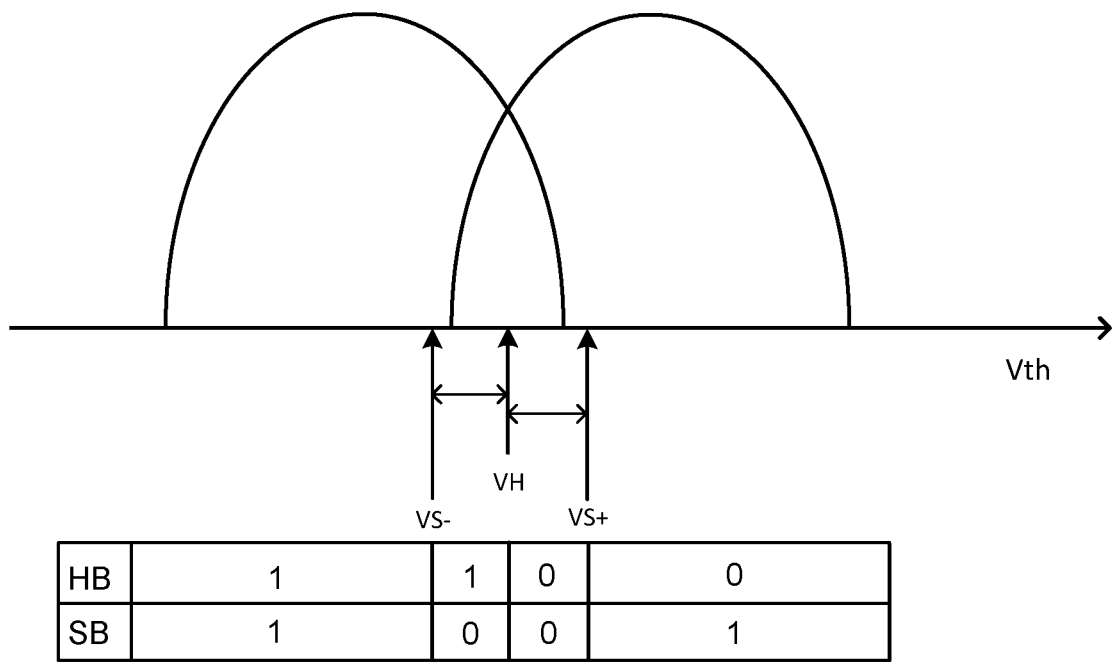
FIG. 8 illustrates the concept of hard bits and soft bits.

FIG. 7 illustrates a conventional read flow that incorporates ECC correction and read error handling. Step 701 is a read of the data stored in the memory cells to determine a "hard bit" (HB), where the hard bit values corresponds to a standard read using the values Vri of FIG. 5A-5C used to differentiate the different states if they were well defined, separated distributions as in FIGS. 5A-5C. Step 703 determines whether the read data is correctable using ECC techniques and, if so, the read process is done at step 705. When the hard bit data becomes uncorrectable by the ECC in step 703, at step 707 a read error handling flow can be invoked, where this can involve various read type to recover read data. Examples of the read types that, depending on the embodiment, can be used to recover the data content are: "CFh read" 711, which is a re-read of the hard bit, but which allows for a longer settling time for bias levels such as the selected word line's voltage; a "soft bit" read 713 that provides information on the reliability of the hard bit value; a "BES read" 715 that tries shifting the hard bit read levels in order to extract the data; and "DLA read" 717 that considers the effects of neighboring word lines on the read-selected word line. One or more of these can be combined, either in various sequences or combinations, to try and extract the data content in the event the basic ECC process fails. For any of the embodiments, once read error handling flow 707 is invoked as step 703, performance is degraded, often severely. The following considers techniques to use soft bit data while reducing its impact on memory performance. FIG. 8 consider the use of soft bits in more detail.

FIG. 8 can be used to illustrate the concept of hard bits and soft bits. FIG. 8 illustrates the overlap of the distribution of two adjacent data states and a set of read values that can be used to determine the data state of a cell and the reliability of such a read, with the corresponding hard bit and soft bits shown in the table underneath for one particular encoding of values. The read value VH is an initial data state value, or hard read, value used to determine a hard bit (HB) value and corresponds to the values Vri of FIG. 5A, 5B, or 5C used to differentiate the different states if they were well defined, separated distributions as in FIGS. 5A-5C. The additional read levels of VS+, margined somewhat above VH, and VS−, margined somewhat below VH, are "soft read" values and can be used to provide "soft bit" (SB) values. The soft bit values give information on the quality or reliability of the initial data state value, or hard bit, data, as the soft bit data provide information on the degree to which the distributions have spread. Some embodiments of ECC codes, such as low density parity codes (LDPC), can use both the hard bit and the soft bit data in order to increase their capability. Although FIG. 8 shows only the pair of soft bit read values, other embodiments can use additional margined read valued to generate more soft bit values for a given hard bit if higher resolution is desired. More generally, the hard bit corresponds to the presumed data value based on a sensing operation and the soft information, which can be a single binary soft bit, multiple soft bits or a decimal/fractional value, indicates the reliability or trustworthiness of the hard bit value. When used in ECC methods that use soft information, the soft information can be treated as the probability that a corresponding hard bit value is correct.

During a read operation, if VH is below the memory cells threshold value, the memory cell will be non-conducting and the read data value (HB) will read as "0". If a memory cell is within the central region of either distribution of FIG. 8, a read at VS+ and VS− will provide the same result; if these reads differ, the memory cell's threshold voltage is between these values and could be from the tail region of either the distribution above or the distribution below, so that the HB data is unreliable. Reading at both these levels and XNOR-ing the results gives an SB value of "1" if the data is deemed reliable and an SB value of "0" if unreliable.

For example, when both the SB+ and SB− read are "0", then:

$$SB = (SB+) XNOR (SB-)$$
$$= \text{"0"} XNOR \text{"0"},$$
$$= 1$$

SB=1 and the HB read value will be treated as reliable. During a soft bit decode in ECC, this will result in memory cell in the upper distribution having HB="0" and SB="1", indicating a reliable correct bit (RCB), whereas a memory cell having a threshold voltage between SB+ and SB− will result in SB="0" to indicate that the HB value is unreliable.

FIGS. 9A and 9B respectively show the read levels for computing hard bit and soft bit values for the lower page of data in a three bits of data per memory cell embodiment using the encoding of Table 2 above, and where soft bit values of 1, 0 respectively indicate that the hard bit value is reliable, unreliable. FIG. 9A shows the threshold voltage distribution of memory cells in a 3-bit per cell, similar to that shown in FIG. 5C, but where the distributions are not as well defined and display some degree of overlap. The overlap of distributions can be from several causes, such as charge leakage or disturbs, where operations on one word line or bit line affect the data state stored on nearby memory cells. Additionally, in an actual write operation, the distributions will often not be as well-defined as shown in FIG. 5C since the writing of memory cells with such accuracy is adverse to performance, as a larger number of fine programming steps and some cells will be hard to program or program overly rapidly. Because this, programming algorithms typically allow for some degree of overlap, relying upon ECC to accurately extract the user data content.

The read points used to differentiate a lower page data value are represented as the broken vertical lines between the Er and A states and between the D and E states, along with the corresponding hard bit values written underneath. Due to the overlap of distributions, a number of memory cells that are storing Er or E data will incorrectly read as HB=0 and a number of memory cells that are storing A or D data will incorrectly read as HB=1. The optimal read values can be determined as part of device characterization and stored as fuse values for the control circuitry, for example. In some embodiments, the control circuit may shift these values to improve their accuracy as part of a standard read operation or as part of a read error handling flow 707 as a BES read 715.

To be able to handle higher amounts of error, stronger ECC can be used. However, this requires storing of more parity bits, reducing the proportion of memory cells available for user data, effectively reducing memory capacity. Additionally, performance is affected as more computations are involved to encode/decode the code words, and write and read the additional ECC data Further, more ECC data needs to be transferred to and from the ECC circuitry over the data bus structures.

FIG. 9B shows the soft bit values and the read points that can be used to determine the soft bit values corresponding to the lower page hard bit values of FIG. 9A. As shown, the soft bit values are determined based on a pair of reads are to either side of the basic hard bit read value. These soft bit read values can be based on offsets from the hard bit read values, either symmetric or asymmetric, and be stored as fuse values in a register determined as part of device characterization, for example. In other embodiments, they may be determined, or updated, dynamically. Although the use of soft bits at step 713 can be quite effective in extracting data content that is not extractable in step 703, it comes with a performance penalty as it needs to be invoked in response to an ECC fail at step 703, uses two additional reads for each hard bit read, requires the soft bit data to be transferred out after the additional reads, and additional computations need to be performed.

Figure 10:
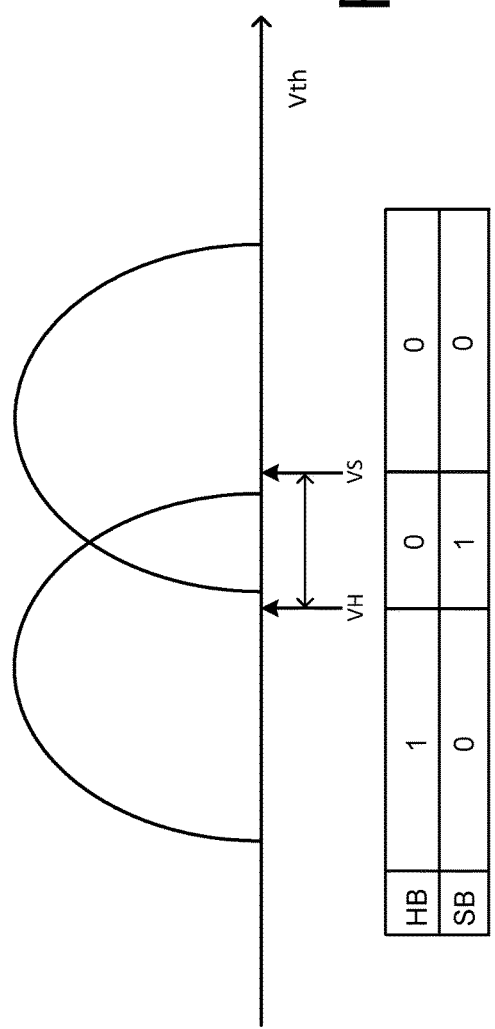
FIG. 10 illustrates the assignment of hard bit and soft bit values and the read levels used in an embodiment for efficient soft sensing.

To improve upon this situation, the following introduces embodiments for an "efficient soft sense mode". In this sensing mode, a hard bit read and soft bit read can be combined into one sequence that uses two sensing levels for sensing time efficiency. By using efficient soft sense read as a default mode, the extra soft bit information can be provided for ECC correction with triggering a read error handling flow. Since only two sensing operations are used to generate both the hard bit and soft bit data, this technique avoids the tripling of sense time that results from a standard hard read plus soft read. Additionally, by merging the hard bit and soft bit sense into one sequence, much of the extra overhead involved in read sequence operations (e.g., enabling charge pumps, ramping up word lines, and so on) can be avoided. FIG. 10 illustrates the use of efficient soft sense mode.

FIG. 10 illustrates the assignment of hard bit and soft bit values, along with the read levels used in an embodiment for efficient soft sensing. FIG. 10 is similar to FIG. 8 and shows the memory cell Vth distribution for two data states that again have overlap in the central area. A hard bit read is again performed, but rather than trying to be placed at or near the center of the overlap region at a point optimized for distinguishing the two states, in this embodiment, the hard bit read is off-set to the lower Vth side so that any memory cell that reads at or below VH is reliably in the lower data state (illustrated here a "1" as in the example FIG. 8). It is also assigned a soft bit value of "0", where, in contrast to the embodiment of FIG. 8, a SB=0 value now indicates a reliable HB value. If the memory cell reads above VH, its hard bit value corresponds to the higher Vth data state with HB=0. Rather than the two soft bit reads of FIG. 8, in the embodiment of FIG. 10, only a single soft bit read is performed as a VS value offset to the high Vth side. If the memory cell's Vth is found to be above VS, it is assigned an HB value of HB=0 and considered reliable (HS=0). For a memory cell having a Vth found to be between VH and VS, the memory cell is assigned HB=0, but considered unreliable (SB=1). Note that in the embodiment of FIG. 10, only one of the two states is checked for soft bit data, so that only the HB=0 state may have either SB value, while the HB=1 memory cell will always have SB=0. Put another way, soft bit data is only determined on the one side (here the lower side, for HB=0) of the pair of overlapping distributions, and not on the other side (here the high side, for HB=1). In this embodiment, the single VS read is performed to the left (higher Vth) of the VH read, but in other embodiments the arrangement can be reversed.

Although the total amount of data generated in the embodiment of FIG. 10 is less than that of FIG. 8, the efficient soft sense mode of FIG. 10 will often be sufficient to extract the user data content without resort to further read error handling. As there are only two reads involved in the determinations of FIG. 10, sensing times are shorter, and can reduced even further by doing both reads as single sensing operation, as described with respect to FIG. 12. Additionally, less data is transferred to the ECC engine or engines: in FIG. 8, four combinations of (HB, SB) data result, while in FIG. 10 there are only three combinations, or 25% less data. The increased error toleration provided by efficient soft sensing can also improve write performance as data need not be programmed as accurately, allowed relaxed programming tolerances.

Figure 11:
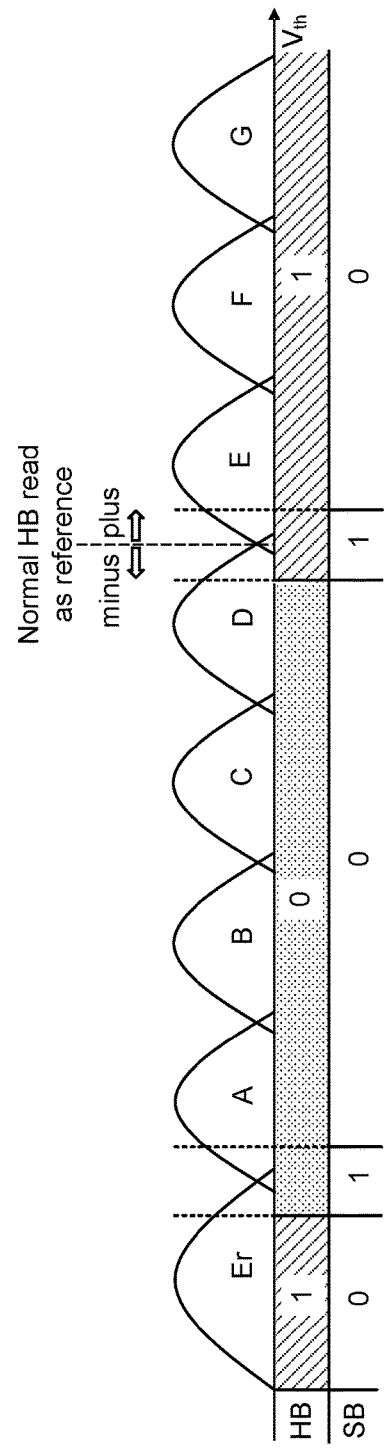
FIG. 11 illustrates the application of efficient soft sense mode to lower page data in a three bits of data per memory cell embodiment using the encoding of Table 2.

FIG. 11 illustrates the application of efficient soft sense mode to lower page data in a three bits of data per memory cell embodiment using the encoding of Table 2. FIG. 11 is similar to FIGS. 9A and 9B, but combines the HB and SB values into a single figure and uses the single SB read level for a given HB read level of an efficient soft sense, rather than a pair of SB reads for a given HB. For example, looking at the differentiation of the Er state from A state, for the left hand read, memory cells to the left are reliably a "1" for the lower page value, with (HB, SB)=(1,0), where again it is noted that in this encoding SB=0 indicates a reliable HB value and SB=1 indicates an unreliable HB value. For the right hand read for Er, A, a memory cell to the right indicates a memory cell that has a reliable lower page value of "0", or (HB, SB)=(0,0). Memory cells with a Vth between the left and right read levels are assigned a lower page hard bit value of 0, but considered unreliable, so that (HB, SB)=(0,1). Similarly, for the reads to distinguish between the D and E states, memory cells to the left of the left read are reliably "0" ((HB, SB)=(0,0)), memory cells above the right read are reliable lower page "1" data ((HB, SB)=(1,0)), and memory cells between the two are assigned an unreliable lower page value of "1" ((HB, SB)=(1,1)).

Figure 12:
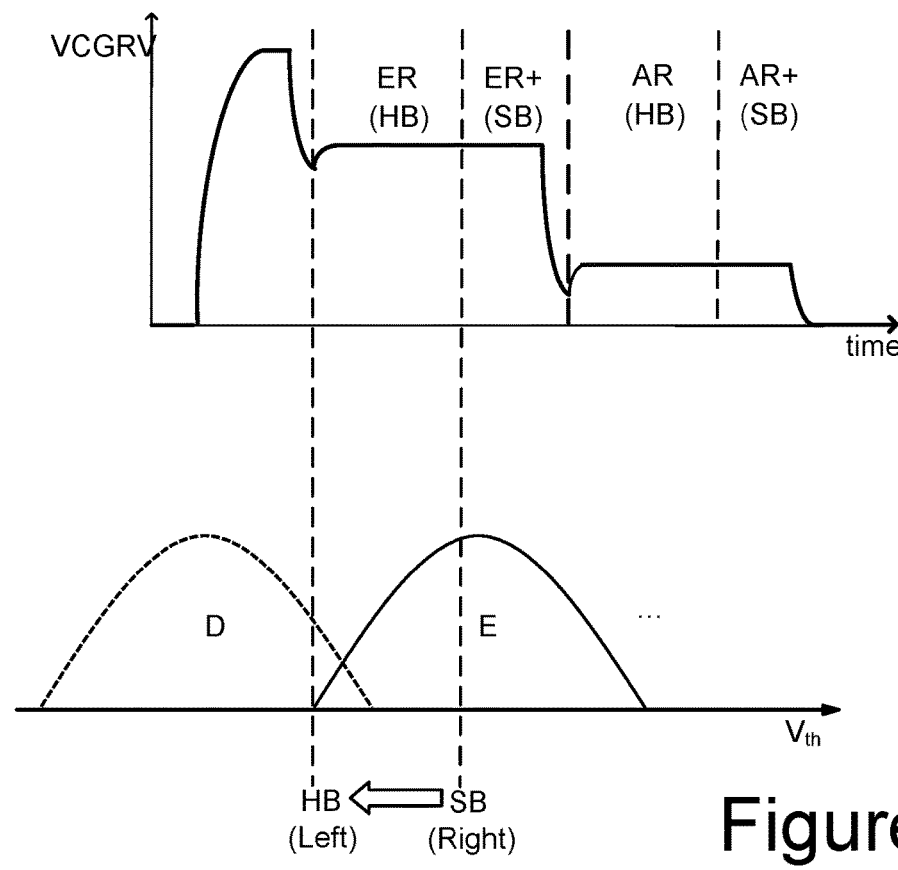
FIG. 12 illustrates an embodiment for the sensing operations for the lower page data read operations in an efficient soft sense read operation, corresponding to the read points illustrated in FIG. 11.

FIG. 12 illustrates an embodiment for the sensing operations for the lower page data read operations in an efficient soft sense read operation, corresponding to the read points illustrated in FIG. 11. At top, FIG. 12 illustrates a control gate read voltage VCGRV waveform that can be applied to the word line of a selected memory cell versus time for an efficient soft sense for lower page data of a 3-bit per cell memory cell, where the broken vertical lines correspond to the four read points as also marked by broken lines in FIG. 11 (although, as will be explained, the order of determination differs). Below the waveform is shown how these reads using the waveform at top corresponds to the Vth values of the D and E state distributions.

To improve read time performance, the embodiment of FIG. 12 uses a "reverse-order" read mode, although other embodiments can use the standard order. In a standard read order, the read voltage applied to selected memory cells starts with the lower values and works its way up. In the reverse-order read mode, the control gate read voltage (VCGRV) applied to a selected word line is initially ramped up to a high value and then the reads are performed from higher Vth states to lower Vth states. In this example for a lower page read, the read to differentiate the D and E states is performed before the read to differentiate the A state from the erased Er state. Consequently, after the initial ramp up, the VCGRV voltage drops down to the read level for the E state read level (ER) and then drops down to the A state read level (AR). This order can reduce the time needed for much of the extra overhead (e.g., enabling charge pumps, ramping up word lines, and so on) involved in read sequence operations.

For each read voltage level, two sensing operations are performed to generate the hard bit and the soft value, allowing for a faster sensing time than if separate read voltages were used. Referring to the D and E state distributions at the bottom of FIG. 12, both the broken line for the HB demarcation and the broken line for the SB demarcation are relatively close Vth values, but where the SB demarcation is shifted to the right at a higher Vth value. Consequently, in an embodiment where the sense is based on discharging a voltage through the selected memory cell, if the read voltage ER is selected such that both HB and SB Vth values conduct to some degree, but by differing amounts. The HB demarcation corresponds to a lower Vth value, as a memory cell at this point will be more conductive to one at the SB demarcation, will consequently discharge more quickly, and can be determined using a shorter sensing interval. The more slowly discharging SB demarcation point is sensed with the same control gate voltage, but a longer sensing time.

Figure 13:
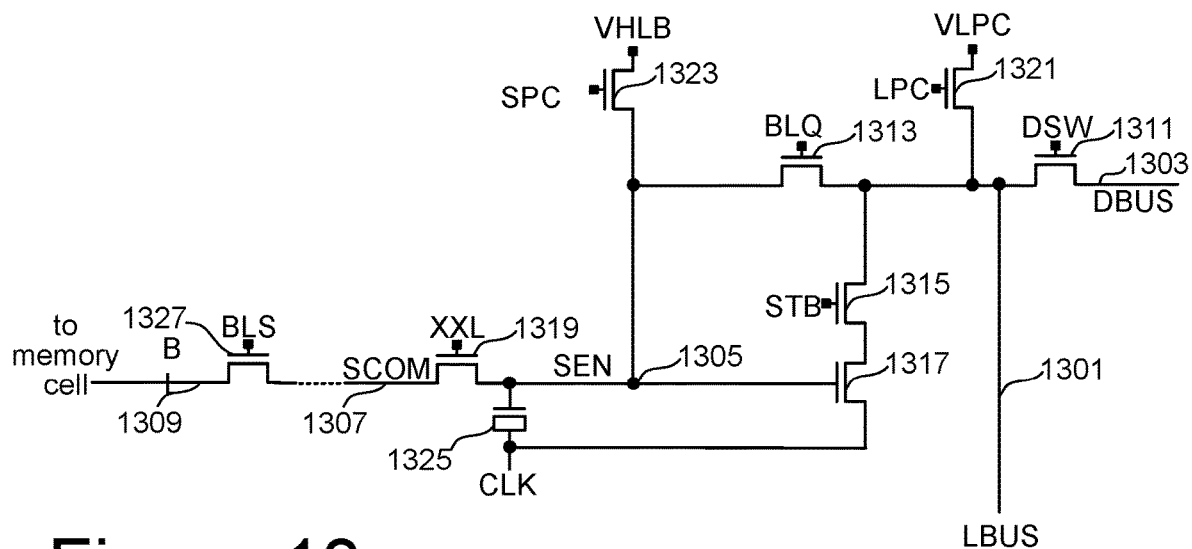
FIG. 13 illustrates an embodiment of a sense amplifier circuit that can be used to determine the hard bit and soft bit values of a memory cell.

FIG. 13 illustrates an embodiment of a sense amplifier circuit that can be used to determine the hard bit and soft bit values of a memory cell. The sense amplifier circuit of FIG. 13 can correspond to the sense amp(s) 230 of FIG. 2A or 2B and as included into the structure of FIG. 3. In the embodiment of FIG. 13, a memory cell's state is determined by pre-charging a sense line or node SEN 1305 to predetermined level, connecting the sense node to the bit line of a biased selected memory cell, and determining the extent to which the node SEN 1305 discharges over a sensing interval. A number of variations are possible, depending on the embodiment, but the embodiment of FIG. 13 illustrates some typical elements. The node SEN 1305 can be pre-charged to a level VHLB by way of switch SPC 1323, where the notation for many of the MOSFET switches here uses the same name for the transistor and the corresponding control signal, where the various control signals can be provided by processor 330, state machine 262, and/or other control elements of the embodiments of FIGS. 2A, 2B, and 3. The node SEN 1305 can be connected to a selected memory cell along a bit line BL 1309 by way of a switch XXL 1319 to a node SCOM 1307 and then, after possibly intervening elements, to a bit line select switch BLS 1327 corresponding to the decoding and select circuitry of the memory device. The SEN node 1305 is connected to the local data bus LBUS 1301 through switch BLQ 1313, which in turn can connect to the data DBUS 1303 by way of switch DSW 1311. A switch LPC 1321 can be pre-charged to a level VLPC, where the values of VHLB and VLPC depend on the particulars of the embodiment and specifics of the implementation.

In a sense operation, a selected memory cell is biased by setting its corresponding selected word line to a read voltage level as described above. In a NAND array implementation, the selected gates and the non-selected word lines of the selected word line's NAND string are also biased to be on. Once the array is biased, the selected memory cell will conduct a level based on the relation of applied read voltage to the memory cell's threshold voltage. The capacitor 1325 can be used to store charge on the SEN node 1305, where, during pre-charging, the level CLK (and lower plate of capacitor 1325) can be set to a low voltage (e.g., ground or VSS) so that the voltage on the SEN node 1305 is referenced to this low voltage. The pre-charged SEN node 1305 of a selected memory is connected to the corresponding bit line 1309 by way XXL 1319 and BLS 1327 to the selected bit lines and allowed to discharge for a sensing interval to a level dependent on the threshold voltage of the memory cell relative to the voltage level applied to the control gate of the selected memory cell. At the end of the sensing interval, XXL 1319 can be turned off to trap the resultant charge on SEN 1305. At this point, the CLK level can be raised somewhat, similarly raising the voltage on SEN 1305, to account for voltage drops across intervening elements (such as XXL 1319) in the discharge path. Consequently, the voltage level on SEN 1305 that controls the degree to which the transistor 1317 is on will reflect to the data state of the selected memory cell relative the applied read voltage. The local data LBUS 1301 is also pre-charged, so that when the strobe transistor STB 1315 is turned on for a strobing interval, LBUS will discharge to the CLK node as determined by the voltage level on SEN 1305. At the end of the strobe interval, STB 1315 is turned off to set the sensed value on LBUS and the result can be latched into one of the latches as illustrated in FIG. 3.

Referring back now to FIG. 12, after biasing the selected memory cell to the ER voltage level, along with other array biasing (select gates, non-selected word lines, etc.) as needed, the pre-charged SEN node 1305 is discharged for the interval ER between the broken lines: if the level on SEN is high enough to discharge LBUS 1301 when STB 1315 is strobed, the memory cell's Vth is below HB; if not, it is above HB. After discharging for the additional interval ER+, STB 1315 is strobed again: if LBUS 1301 now discharges, the memory cell's Vth is between HB and SB; if not, it is above SB. The process is then repeated with the VCGRV value at the AR level to determine the HB and SB values for distinguishing between the A and erased states.

Consequently, under the embodiment illustrated with respect to FIG. 12, for each VCGRV level, the left sensing result is used to generate HB data and the right sensing result is combined with left sensing result to generate SB data. To optimize performance for two senses (Left/Right), the embodiment of FIG. 12 uses "sense time modulation" for Vth separation without a word line voltage level change.

With respect to the efficient soft sense read level controls and parameters, similarly to the usual implementations of read parameters, these can be determined as part of the device characterization process and stored as register values (such as control data parameters set as fuse values in storage 266), determined dynamically, or some combination of these. In one set of embodiments, hard bit and soft bit read levels for an efficient soft sense can be referenced to the standard, hard read values. Even if the efficient soft sense read process is used as default read operation, a memory device will often have a standard read (i.e., hard bit only) as a read mode option, so that the standard read values of FIGS. 5A-5C will be available as a read option. For example, referring back to FIG. 11 and the read levels related to distinguishing between the D and E state distributions, the efficient soft sense levels can be referenced relative to the normal HB read trim values represented to the heavier broken line at the cusp of the D state and E state distributions. The efficient soft sense read levels for the left read (the efficient soft sense hard bit, minus level) and the right read (the efficient soft sense soft bit, plus level) can be specified relative to the normal HB read levels. This allows for the re-use of set feature registers for to generate the efficient soft sense left/right shifts and, in one set of embodiments, a common setting can be used for all planes with individual settings for each of the states.

Figure 14:
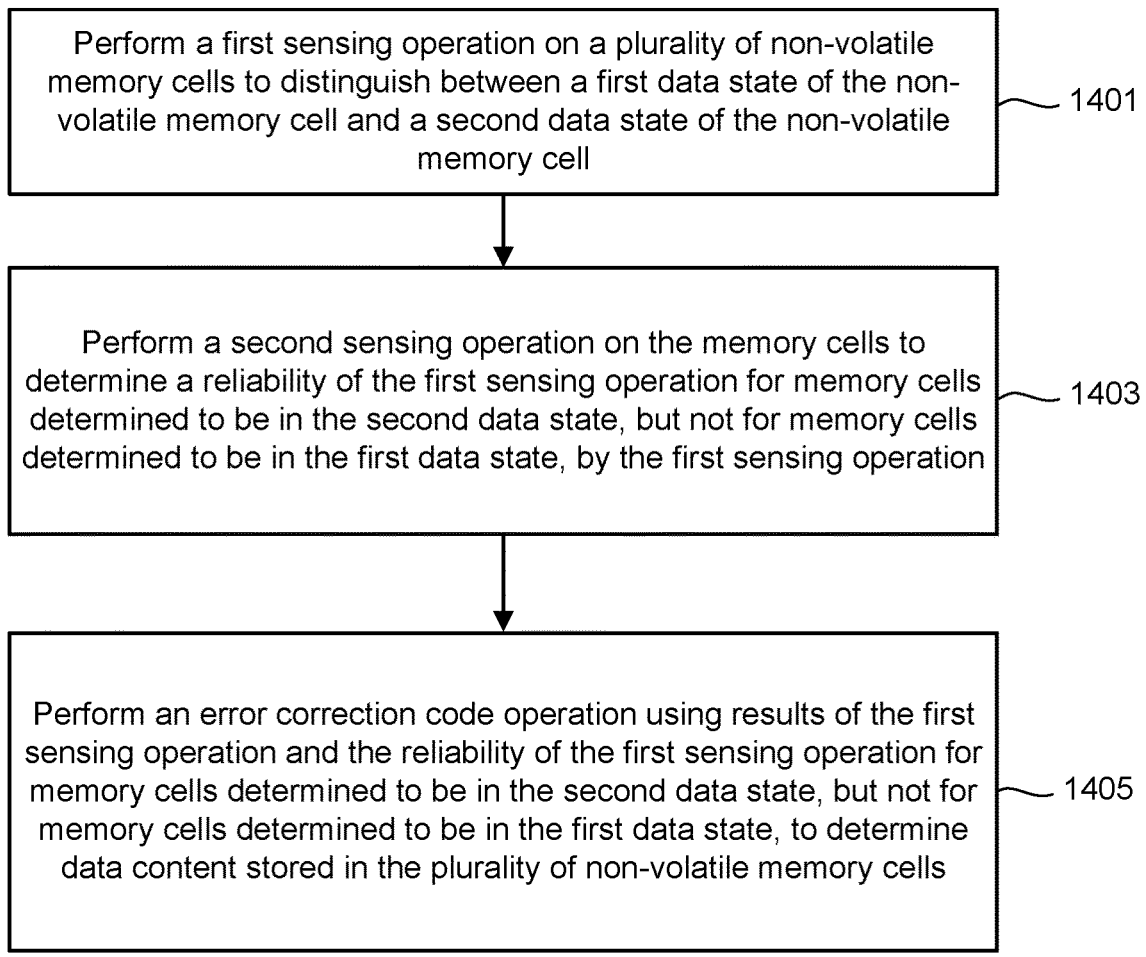
FIG. 14 is a flowchart for an embodiment of an efficient soft sense operation.

FIG. 14 is a high level flowchart for an embodiment of an efficient soft sense operation. The process is described in the context of a memory system as described above with respect to FIGS. 1-4G and the embodiment described with respect to FIG. 12. The flow begins at step 1401 to perform a first sensing operation on a plurality of memory cells to determine hard bit values that distinguish between two of the data states of the memory cells. In an efficient soft sense embodiment, both the hard bit reads of step 1401 and the soft bit reads of step 1403 can be in response to a single read command. For example, referring back to FIG. 1, the host 102 and/or non-volatile memory controller 120 can issue an efficient soft sense command to one or more of the memories 130. The system control logic 260 (FIGS. 2A and 2B) then performs a sensing operation, such as the reading of a lower data page in the above examples, to determine both a hard bit value and soft bit value of the memory cells as illustrated in FIG. 11.

To perform the hard bit determination of step 1401, in the embodiments described above the memory array is biased for the read operation and the sense node of the corresponding sense amplifier or amplifiers are pre-charged. More specifically, for the embodiments used as examples herein, the control gates of the selected memory cells are biased through their corresponding word lines at a read voltage for differentiating between the data states and other array elements (e.g., selected gates and non-selected word lines of NAND strings) are biased as needed based on the memory architecture. When using a sense amplifier, such as that of FIG. 13, where data states are determined on discharging a sense node SEN 1305, the sense node SEN 1305 is pre-charged and connected to the bit line of a selected memory cell to discharge for a first sensing interval (the ER (HB) demarcated region of FIG. 12) to determine the hard bit value.

As illustrated with respect to the embodiment of FIG. 11, the hard bit determination is shifted to a lower Vth value, so memory cells sensed to be below this value are reliably in this value, while memory cells sensed to be above this value include both reliable and unreliable hard bit values. In embodiments using the more traditional order sensing, the hard bit sensing for the hard bit and then the soft bit for distinguishing between the Er and A state would be performed first, followed by the hard bit and soft bit for distinguishing between the D and E state, where each of these would involve a different bias and sense node pre-charge for each sense operation. In the reverse order sensing operation illustrated with respect to FIG. 12, the hard bit and soft bit values are first determined for the D state and E state differentiation followed by the hard bit and soft bit values determination for the Er and A states. Although the flow of FIG. 14 presents the hard bit determination (step 1401) before the soft bit determination (step 1403), in some embodiments the order can reversed. Additionally, the flow of FIG. 14 only has a single hard bit and single soft bit determination, in many cases (as in FIG. 12), multiple hard bit/soft bit pairs will be determined.

At step 1403 a second sensing operation is performed to determine a soft bit. In the efficient soft sense process, this is only reliability information is determined for memory cells having a first, but not a second, of the hard bit values. For example, in the embodiment of FIG. 11, as the hard bit demarcation is shifted downward, the soft bit value is only for the higher of the hard bit values. In the embodiment described with respect to FIG. 12, the second sensing operation is based on a longer discharge time of the pre-charged sense node SEN 1305. If the read involves distinguishing between one pair states (such as in a binary memory cell embodiment), only the one hard bit, soft bit pair is determined. In the case of multi-level memory cells, additional hard bit, soft bit pairs are determined, as in the examples above in FIGS. 11 and 12 where a lower page sensing operation also determines a hard bit, soft bit pair similarly to steps 1401 and 1403 for the Er/A state determination. Once the hard bit, soft bit data values are determined, they can be used to perform as ECC operation at step 1405. This can be done on the non-volatile memory controller 120 in ECC engine 158, on the control die 211, or some combination of these.

Although the use of efficient soft sensing reduces the amount of soft bit data determined and, consequently, the amount of soft bit data to be transferred to an ECC engine relative to a standard hard bit, soft bit arrangement, it is still a significant increase of data relative to when just hard bit data is used. To reduce the amount of data needing to be transferred from a memory die to the ECC engine, the soft bit data can be compressed in the memory prior to being transferred over the bus structure to the non-volatile memory controller. The following discussion presents techniques to compress soft bit data. These techniques can be applied to both efficient soft sensing and also to standard soft sensing, although the discussion below will primarily use the example of an efficient soft sensing embodiment.

More specifically, the example embodiments presented below will primarily be based on the efficient soft sense mode as described above with respect to FIGS. 10-14. As described above, the efficient soft sense mode can reduce the performance drop when soft bit data is used, making it practical as a default read mode with one page of hard bit data and one page of soft bit data output in one read sequence. These pages of soft bit and hard bit data are then transferred to an error correction engine to extract the data content of the page of user data. In some embodiments, part or all of the ECC operations can be performed on the control die 211 of FIG. 2B or the memory die 200 of FIG. 2A, but typically the ECC operations are performed on an ECC engine 158 on the non-volatile memory controller 120, requiring the read hard bit and soft bit data to be transferred by the interface 269 over the external data bus structure to the controller 120. To take an example of the amounts of data involved, a page of data from a single plane in an embodiment of a 3D NAND memory can be 16 KB of user data along with corresponding parity bits and redundancy data for defective memory locations. Consequently, without compression, in addition to the 16+ kilobytes of hard byte data per plane, 16+ kilobytes of soft bit data per plane would also be transferred.

To maintain memory performance, the soft bit data can be compressed on the memory die 200 or control die 211 prior to transfer. For example, if a compression factor N is used, the amount of soft bit data is transferred is reduced by 1/N, so that the choice of compression factor is a trade-off between speed and amount of soft bit data available for the ECC engine. A number of compression techniques can be used with varying compression factors. For example, a compression factor of N=4 can be implemented by a logical operation of AND-ing the soft bit data in sets of four soft bits. Although this would not indicate the individual reliability of the corresponding hard bit values, it would indication that at least one of a set of four hard bit values should be treated as unreliable.

Figure 15:
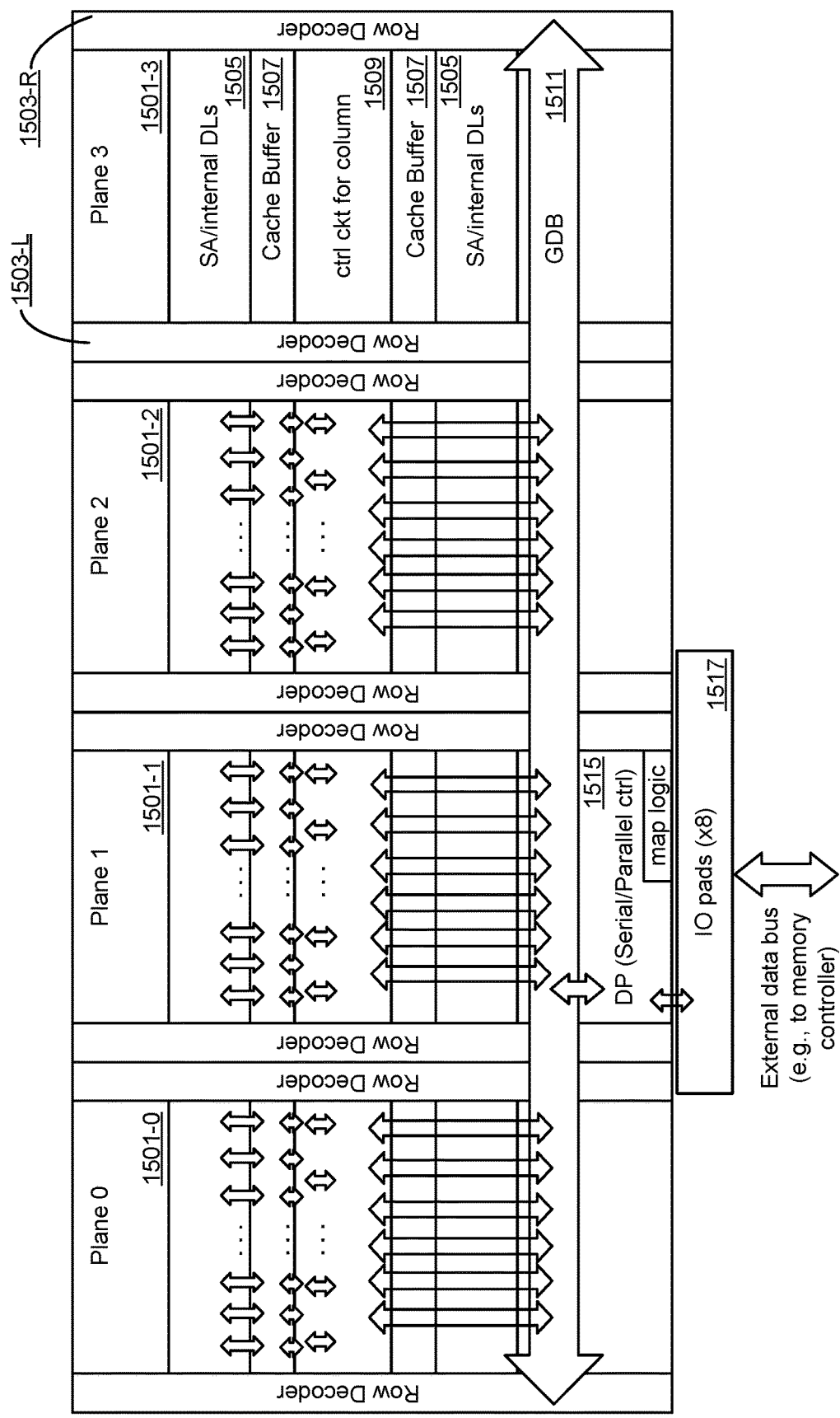
FIG. 15 is a block diagram of an embodiment for some of the control circuit elements of a memory device including a soft bit compression element.

FIG. 15 is a block diagram of an embodiment for some of the control circuit elements of a memory device that includes a soft bit compression element. The shown example is for a four plane memory device and most of the shown elements can be repeated for each plane, but other embodiments can use fewer or more planes. Depending on the embodiment, these control circuit or circuits can be on a control die 211 bonded to one or more memory die 201, as is FIG. 2B. In other embodiments, the one or more control circuits can be on a memory die 200 containing the memory arrays 202, such as being located on the periphery of the memory die 200 or formed on the substrate under the 3D NAND memory structure described above.

In FIG. 15, in order to simplify the drawing, only the common blocks of plane 3 1501-3 are labeled, but it will be understood that each of the common blocks plane 0 1501-0, plane 1 1501-1, plane 2 1501-2, and plane 3 1501-3 include respective common blocks 1505, 1507, and 1509. These blocks correspond to elements of row control circuitry 220, column control circuitry, and system control logic 260 of FIGS. 2A and 2B, but are more representative of how these elements are physically arranged in some embodiments. To either side of each plane are row decoders 1503-L and 1503-R that can decode connections to the word lines and select lines of the plane's array and can correspond to the row decoders 222 and other elements of the row control circuitry 220 of FIGS. 2A and 2B. A column control circuit 1509 can correspond to the column control circuitry 210 of FIGS. 2A and 2B. To either side above and below of the column control circuit for columns 1509 are a set of sense amplifiers 1505, including the internal data latches, and a cache buffer 1507. Referring back to the sense amplifier circuitry of FIG. 3, the internal data latches of 1505 can correspond to the ADL, BDL, CDL data latches and the cache buffer 1507 can correspond to the transfer data latches XDL. Although not labelled, the other planes include similar elements. Instead, the other planes includes arrows indicating the data flows for data transferred between the memory cells of the plane and the I/O interface, where similar transfers can also occur in plane 3 1501-3, but are not shown so that the labelling of blocks can be shown.

The one or more control circuits presented in FIG. 15 also include an input-output, or IO, circuit including IO pads 1517 and a data path (DP) block 1515 that performs (multi-bit) serial to parallel transformations of inbound write data and parallel to (multi-bit) serial transformations for outbound read data. The DP block 1515 is connected to the byte wide (in this example) IO pads 1517 for transferring data over an external data bus to and from the non-volatile memory controller 120. In the block diagram of FIG. 15, the DP block 1515 and the IO pads 1517 are located at plane 1 1501-1. However, these elements can be placed on any of the planes or distributed between the planes, although locating these on one of the central planes (Plane 1 1501-1 or Plane 2 1501-2) reducing routing. A global data bus GDB 1511 internal to the memory device spans the planes, allowing for data to be transferred to and from the individual planes and the DP block 1515. The vertical arrows of FIG. 15 illustrate the data flow for the transfer of data between the upper of the sense amplifier blocks 1505 and the IO pads 1517, where these are not shown for Plane 3 1501-3 to allow for the block labelling. In a read process, pages of data from the memory array of a plane are sensed by the sense amplifiers 1505 and stored in the corresponding internal data latches, then shifted into the cache buffer 1507 of the transfer latches, and on though the decoding of the control circuit for columns 1509 to the global data bus 1511. From the global data bus 1511, hard bit data then moves on through the DP block 1515 to be placed into (byte wide) serial data to be transferred out over the IO pads 1517. When writing data, the flow of data can be reversed along the path used by the hard bit data.

Figure 16:
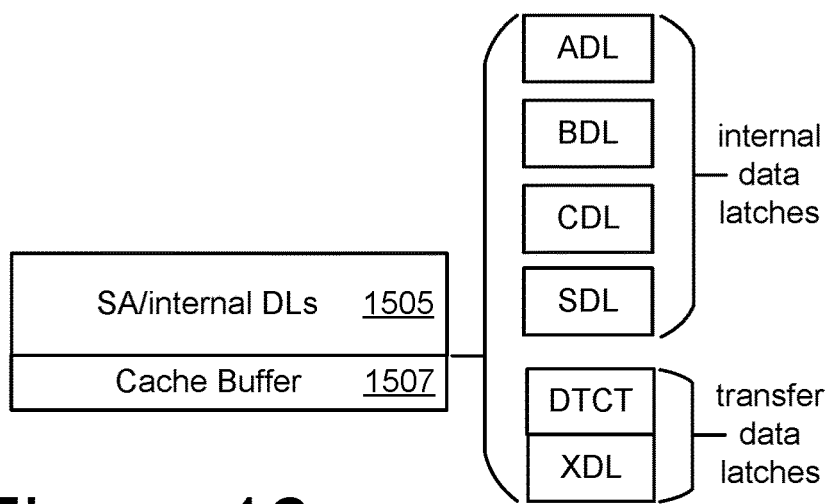
FIGS. 16, 17A, and 17B provide more detail on embodiments for the data latches that can be used in the soft bit data compression process.
Figure 17A:
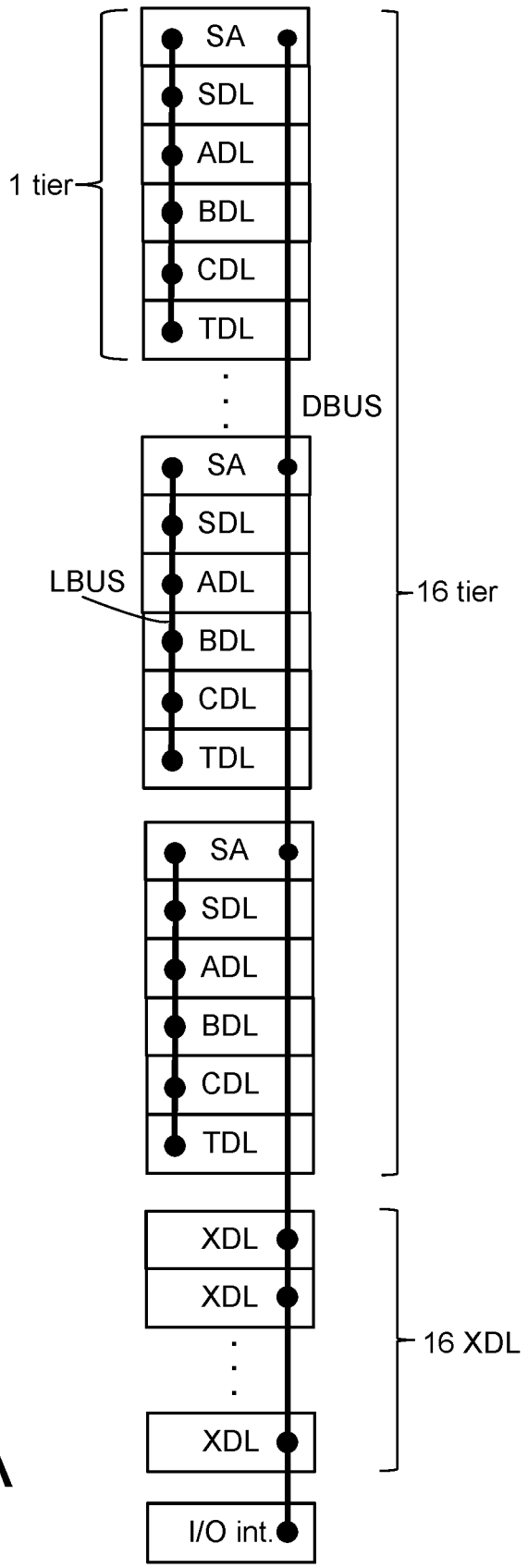
Figure 17B:
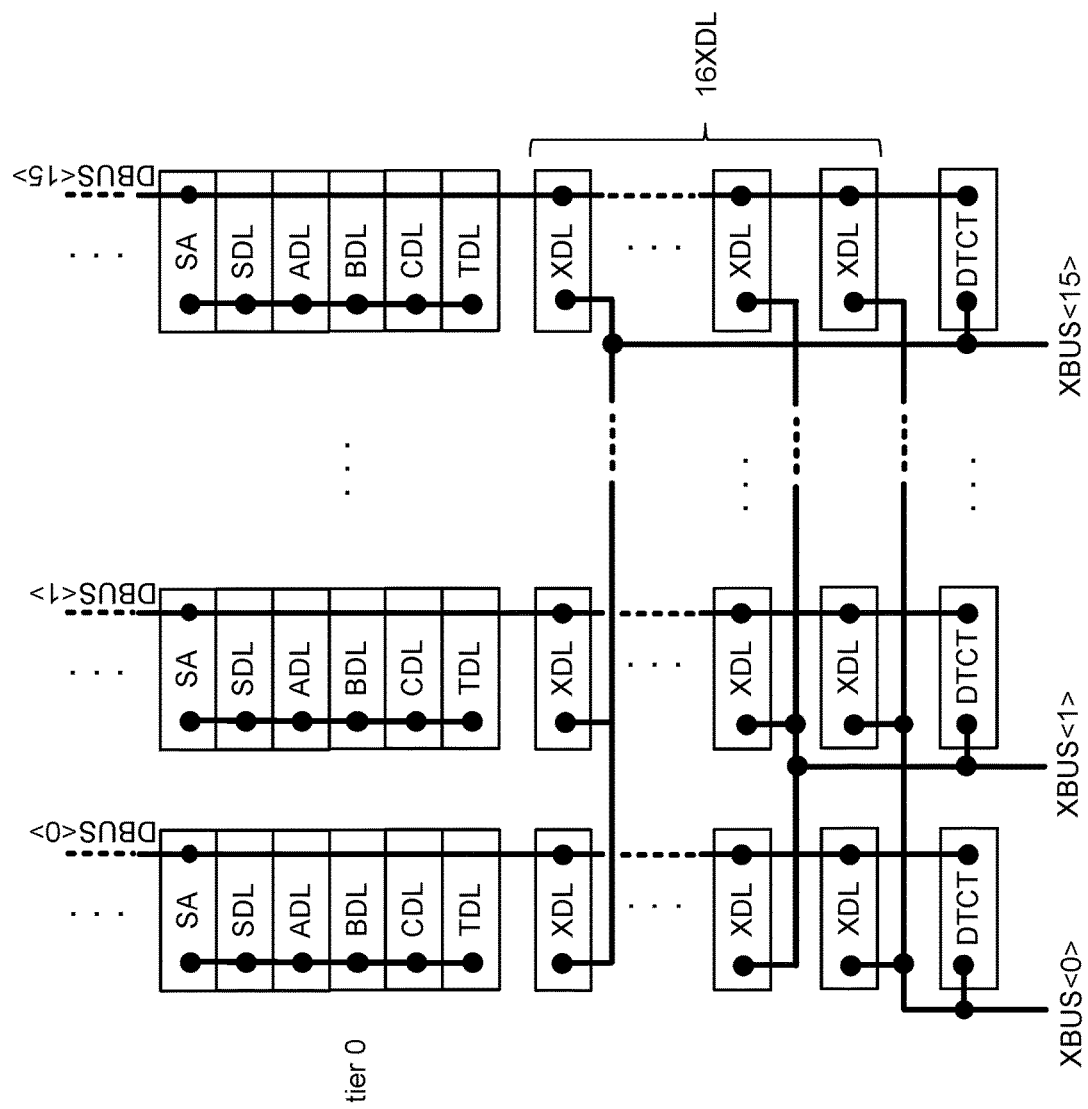

With respect to the corresponding soft bit data, after the soft bit data is determined (whether for an efficient soft sense operation or a traditional soft sense operation), the soft bit data is compressed prior to being transferred off of the memory device and to the ECC engine. The embodiments presented in the following discussion for compressing the soft bit data perform the compression within the SA/internal data latches 1505 and the transfer latches of the cache buffer 1507. After being compressed, the compressed soft bit data can follow the same path as the hard bit data from the cache buffer 1507 to the IO pads 1517. As the compression process can affect the logical address assignment of the soft bit data, the DP block 1515 can incorporate map logic so that compressed soft bit data is properly assigned. FIGS. 16, 17A, and 17B provide more detail on embodiments for the data latches that can be used in the soft bit data compression process.

FIG. 16 is a schematic representation of the correspondence between the SA/internal data latches 1505 and the transfer latches of the cache buffer 1507 of FIG. 15 and the sets of data latches 340, 342, 344 and 346 of FIG. 3. The internal data latches associated with sense amplifier of SA/internal DLs can include the latches ADL, BDL, and CDL, along with sense amp data latch (SDL) and possibly other data latches, depending on the embodiment. The cache buffer includes the transfer data latches XDL and also include additional latches, such as latches DTCT latches for temporary data storage and operations such as bit scan operations. The internal data latches are connected along a local data bus LBUS, with the internal data latches connected to the transfer data latches along a data bus DBUS. This is illustrated in more detail with respect to FIG. 17A.

FIG. 17A is a schematic representation of the structure for one embodiment of the data latches. The example of FIG. 17A is for a 3 bit per cell embodiment where each sense amplifier (SA) has a set of associated data latches forming a "tier" including a sense amp data latch (SDL), the data latches for the 3 bit data states (ADL, BDL, CDL), and an auxiliary data latch (TDL) that could be used for implementing quick pass write operations, for example. Within each of these stacks of data latches, data can be transferred between the sense amplifier and its associated set of latches along a local bus LBUS. In some embodiments, each of the sense amplifiers and corresponding set of internal data latches of a tier that are associated with one bit line can be grouped together for a corresponding "column" of bit lines, and formed on a memory die within the pitch of the column of memory cells along the periphery of the memory cell array. The example discussed here uses an embodiment where 16 bit lines form a column so that a 16-bit word is physical located together in the array. An example of a memory array may have a 1000 such columns, corresponding to 16K bit lines. In the topology of the FIG. 4B embodiment, each sense amplifier and its set of associated data latches of a tier are connected along an internal bus structure of DBUSs along which data can be transferred between each of the tier of latches and a corresponding XDL. For the embodiment described in the following, the XDL transfer latches can transfer data to and from the I/O interface, but the other data latches of the tier (e.g., ADL) are not arranged to transfer data directly to or from the I/O interface and must go through the intermediary of the transfer data latch XDL.

FIG. 17B illustrates an embodiment for the group of the columns of FIG. 17A. FIG. 17B repeats the structure of FIG. 17A 16 times, where only the tier 0 internal data latches of each set is shown. Each DBUS is connected to a set of 16 XDLs. Each of the horizontal rows (as represented in the figures) are connected to one of the XBUS lines, so that the lowest row (or "XDL tier") of XDLs is connected to XBUS<0>, the next row or tier of XDLs is connected to XBUS<1>, and so on, with the XDLs of XDL tier 15 connected to XBUS<15>. FIG. 17B also illustrates an arrangement of the DTCT latches, with one DTCT latch for each sense amp tier/DBUS value, that is also connected to one of the XDL tiers/XBUS values. In this arrangement, each DTCT latch is connected to DBUS<i> and XBUS<i> for an i value, so that the left-most DTCT is connected to both DBUS<0> and XBUS<0>, the next DTCT is connected to both DBUS<1> and XBUS<1>, and so on until the right-most DTCT is connected to both DBUS<15> and XBUS<15>. The compression of soft bit data values within the data latch structures described below will be presented in the context of the embodiment of FIG. 17B, although other embodiments can be used. Additionally, although discussed in the context of compressing soft bit data, and more specifically an efficient soft sense embodiment, these compression techniques can be applied to the compression of other data stored in the memory device.

Figure 18:
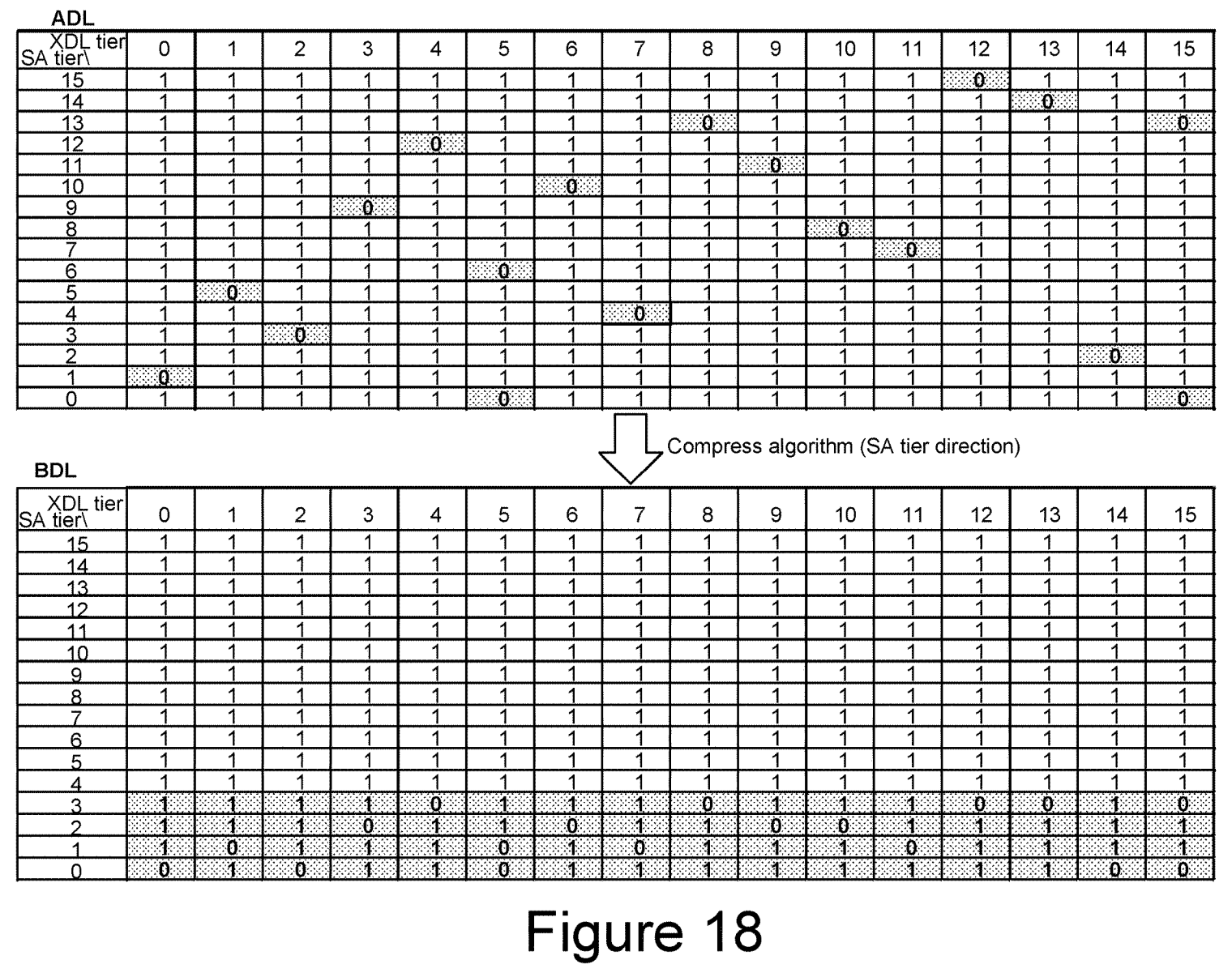

In a vertical compression scheme, the data are compressed within a word unit, with the soft bit (or other data) stored in an internal data latch, compressed, and then written into the XDL latches or, alternately, back into the internal data latches. The compressed data is then reordered within the map logic of the DP block 1515 upon streaming out to place the compressed data into logical user column order. FIG. 18 illustrates the first step in the process for an example embodiment.

FIG. 18 illustrates the compression of the original soft bit data from one set of internal data latches to another set of data latches. In this example, the original soft bit data is stored in the ADL latches and is compressed with a compression factor of N=4 and stored in the BDL latches, but other embodiments can use other combinations of the internal data latches. At the top of FIG. 18 is a 16×16 table of sense amp (SA) tiers arranged vertically and XDL tiers arranged horizontally, as in FIG. 17B, with the entries corresponding to soft bit data from an efficient soft sensing operation and where the squares for the "0" values are highlighted by stippling. In a vertical compression scheme, for each XDL tier (i.e., a column in FIG. 18) the data is compressed from 16 values to 4 values in an N=4 compression, so that the compressed can be stored in just four sense amplifiers tiers of BDL latches, where SA tiers 0-3 store the compressed data and dummy entries (here "1"s) are entered in the other SA tiers for the BDL latches. More specifically, embodiment of FIG. 18, the soft bit data of each XDL tier is grouped in sets of 4 SA tiers and the values AND-ed together according to the compression algorithm:

SA tier[3:0]:BDL[0]=&ADL[3:0];

SA tier[7:4]:BDL[1]=&ADL[7:4];

SA tier[11:8]:BDL[2]=&ADL[11:8]; and

SA tier[15:12]:BDL[3]=&ADL[15:12], where & represents the logical AND of the ADL entries: e.g., &ADL[3:0]=ADL[3] AND ADL[2] AND ADL[1] AND ADL[0].

The lower part of FIG. 18 shows the entries in the compressed efficient soft sense data values in the BDL latches, where the compressed soft bit data is in the bottom four rows SA tiers 0-3, as highlighted by the stippling, and the other rows filled in with dummy "1" values. Looking at the first column for XDL tier 0 values, for example, the SA tier 0 value is "0" to reflect the present of a "0" in ADL[3:0] at SA tier 1, while SA tiers 1, 2, and 3 are all "1" as there are no other "0" values in ADL[7:4], ADL[11:8], or ADL[15:12]. In the example of the XDL tier 15 (farthest right column), the "0" soft bit values in SA tiers 0 and 13 for ADL are reflected in the compressed values of BDL[3:0]=(0110). Note that under this N=4 compression algorithm, a compressed value of "0" indicates that at least one of the four soft bit values is "0" so that all four of the corresponding hard bit values will be treated as unreliable. Although the compressed soft bit data does not provide as fine a level of resolution as for uncompressed soft bit data, it will still typically be enough to significantly help to decode the data. Also, is should be noted that example of soft data at the top of FIG. 18 has a relatively high number of "0" values for purposes of discussion.

FIG. 19 again illustrates an N=4 compression of the original ADL<15:0> data to BDL<3:0>, but in an embodiment using a location based compression algorithm. The original soft bit is again compressed and stored in SA tiers 0-3 of the BDL latches, with dummy "1" values entered in the other SA tiers. To illustrate the location based algorithm, the example uncompressed soft bit data in the ADL latches has a "0" along the anti-diagonal of entries where the SA tier number is the same as XDL tier number. The BDL<3:0> values are then a 4-bit value indicating a SA tier having a "0" soft bit value. For example, in XDL tier 2, the "0" is SA tier 2 corresponds to the 4-bit binary value (0010)=2. For other cases, such as no "0" soft bit values or more than one "0", one of the values (such as (1111)) can be used for these cases as well.

Figure 19:
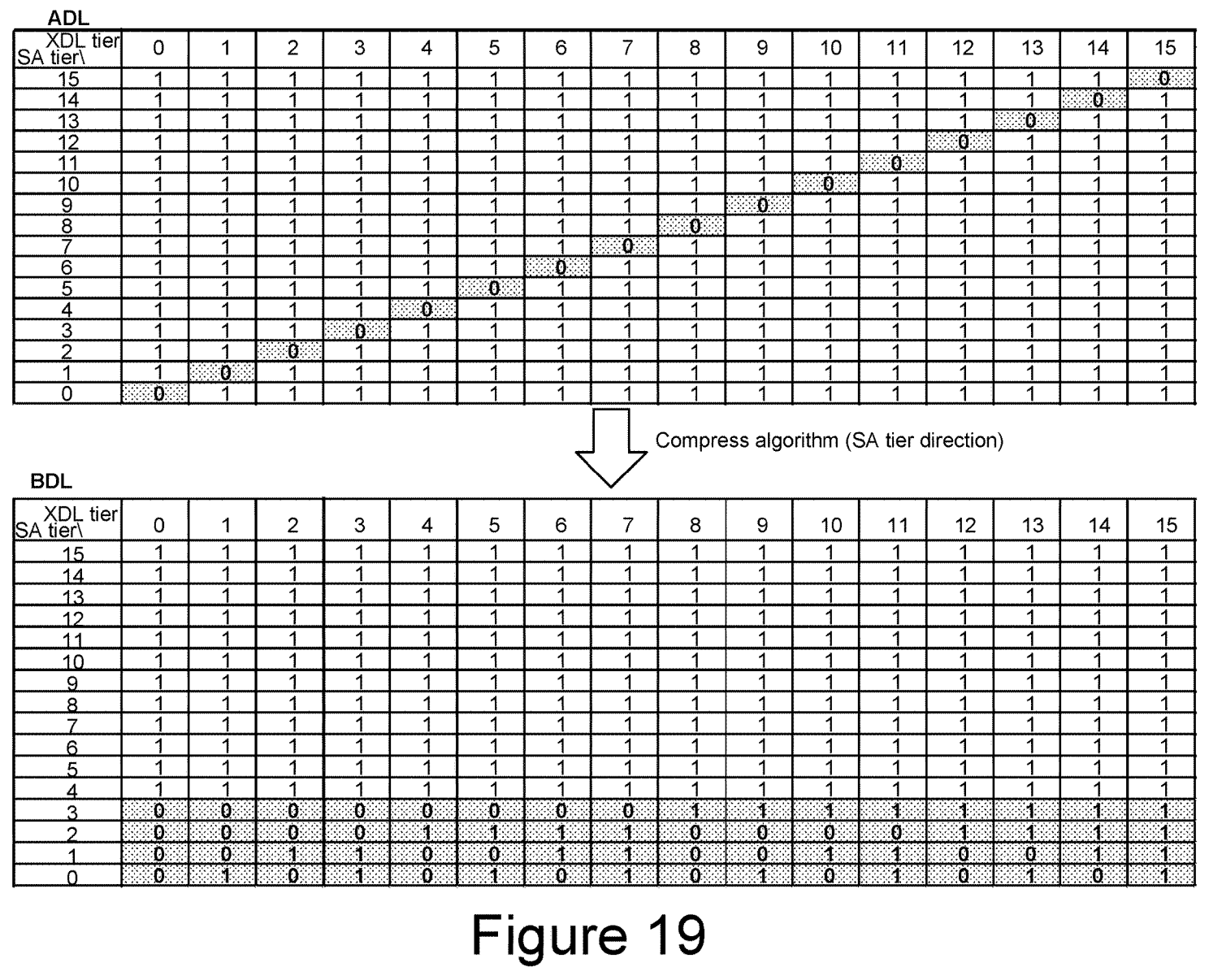
Figure 20:
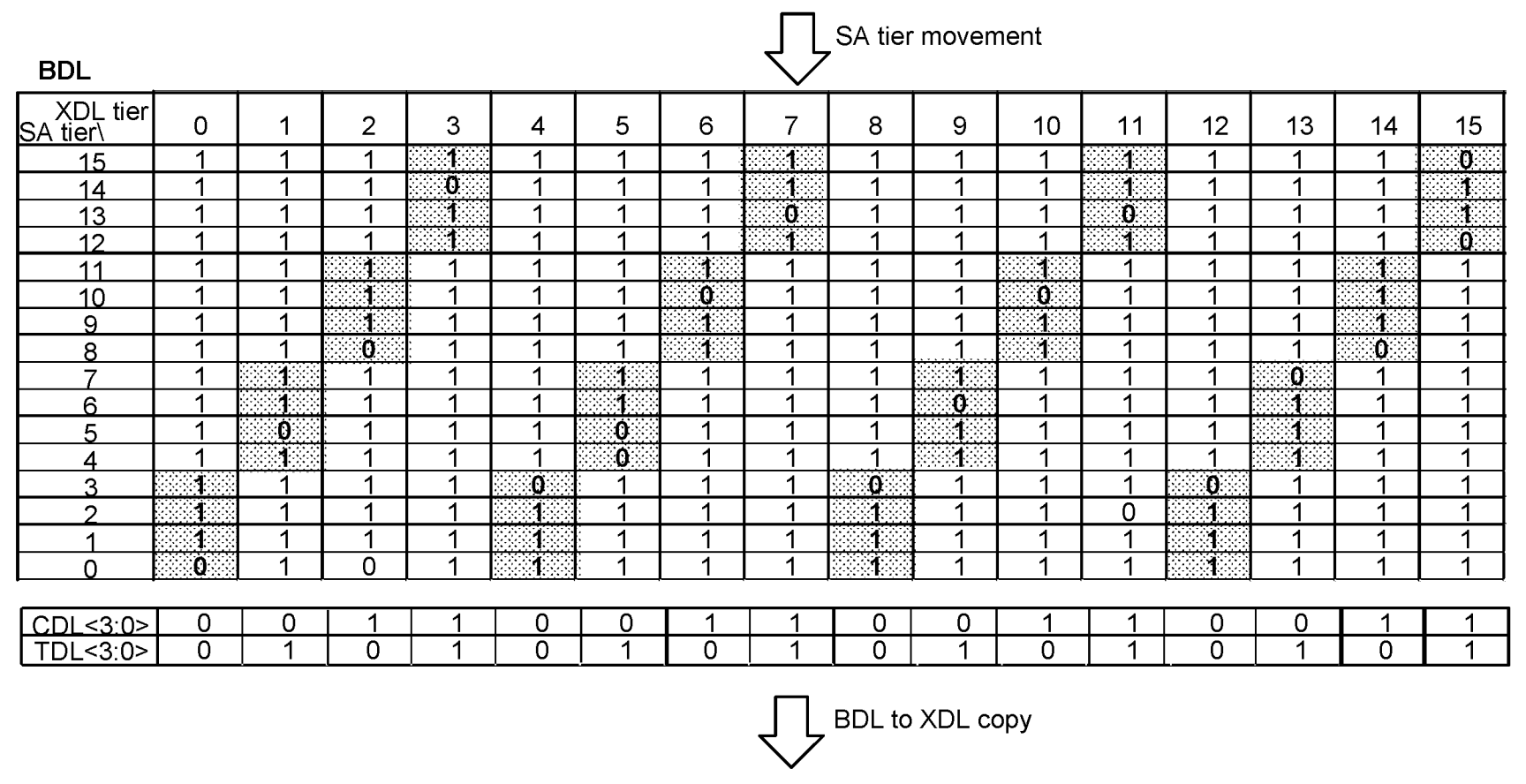

FIG. 20 illustrates the movement of the compressed soft bit data from BDL SA tier<3:0> to different SA tier based on XDL tier information. In this embodiment, the compressed soft bit data values of the XDL tiers of FIG. 18 are moved up to the different SA tiers by an amount depending on the XDL tier, where this is done in a cyclic manner, with XDL tiers 0, 4, 8, and 12 not moved; XDL tiers 1, 5, 9, and 13 moved up 4 SA tiers; XDL tiers 2, 6, 10, and 14 moved up 8 SA tiers; and XDL tiers 3, 7, 11, and 15 moved up 12 SA tiers. In some embodiments, the compression step illustrated with respect to FIG. 18 or 19 can be combined with the rearrangement of FIG. 20. Others of the latches can be used to store the XDL tier information of this movement, where this data can be created for either the XBUS side or the DBUS side. In the embodiment of FIG. 20, the XDL tier information is stored in the CDL and TDL latches as 2-bit values, (00) indicating that the compressed data is not moved, (01) indicating that it is moved up 4 SA tiers, (10) indicating that it is moved up 8 SA tiers, and (11) indicating that has been mover up 12 SA tiers. The compressed data is then moved out of the internal data latches into the XDL transfer latches, where this can be a standard, direct move from BDL to XDL, so that the data would be arranged again as in FIG. 20, but now in the XDL latches, where this is shown at the top portion of FIG. 21.

Figure 21:
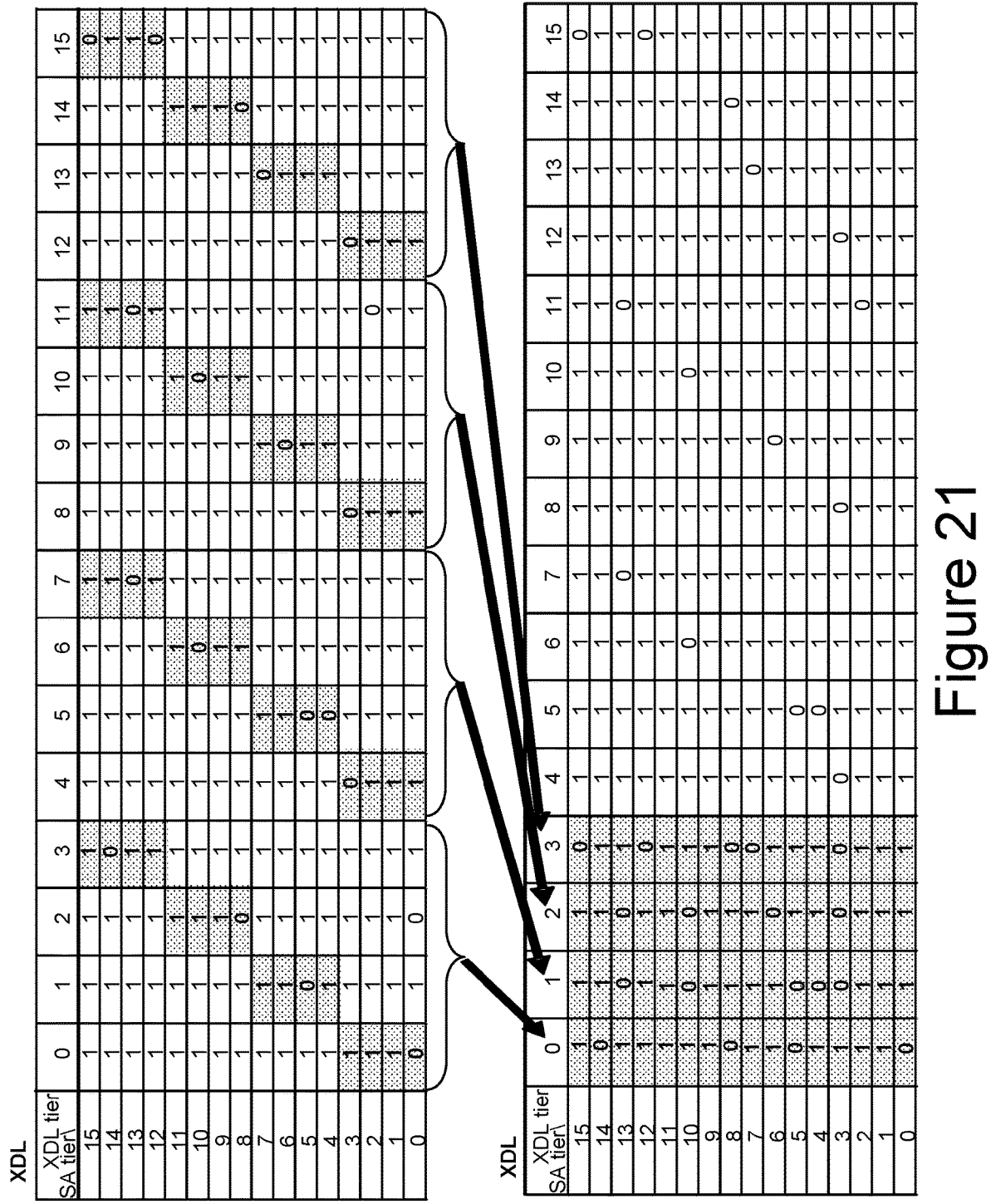
FIG. 21 illustrates a transfer within the transfer latches to compact the compressed data.

FIG. 21 illustrates a transfer within the transfer latches to compact the compressed data. Referring back to FIG. 17B, the XDL to XDL transfers can be perform through the XBUS structure using temporary storage in the DTCT latches. As illustrated in FIG. 21, the compressed data in each of XDL tiers 1, 2, and 3 can be shifted over to XDL tier 0, the compressed data in each of XDL tiers 4, 5, 6, and 7 can be shifted over to XDL tier 1, and so on for the other XDL tiers are represented by the grouping and arrows of FIG. 21. At the end of the process, the compressed data are consolidated or compacted into XDL tiers 0-3, where the previous data can be left in the other tiers until needing to be over-written at some later time. The purpose of this compactification is to combine the compressed data into a limited number of XDL tiers to reduce data out time (from 16 tier output to 4 tier output in the example with a compression factor of N=4).

Referring back to FIG. 15, once the compressed soft bit data has been loaded into the transfer latches of cache buffer 1507 as illustrated in FIG. 21, it can be transferred through the control circuit for columns 1509 to the global data bus 1511, and then to the data path block 1515 for transfer out through the IO pads 1517. However, the data movements illustrated with respect to FIGS. 18-21 can affect the location of the data within the external data latches relative to their local user address locations. To account for this, map logic in the data path block 1515 can be used to reshuffle the data bits of the compressed soft bit data to be in consecutive logical column order during data output.

Figure 22:
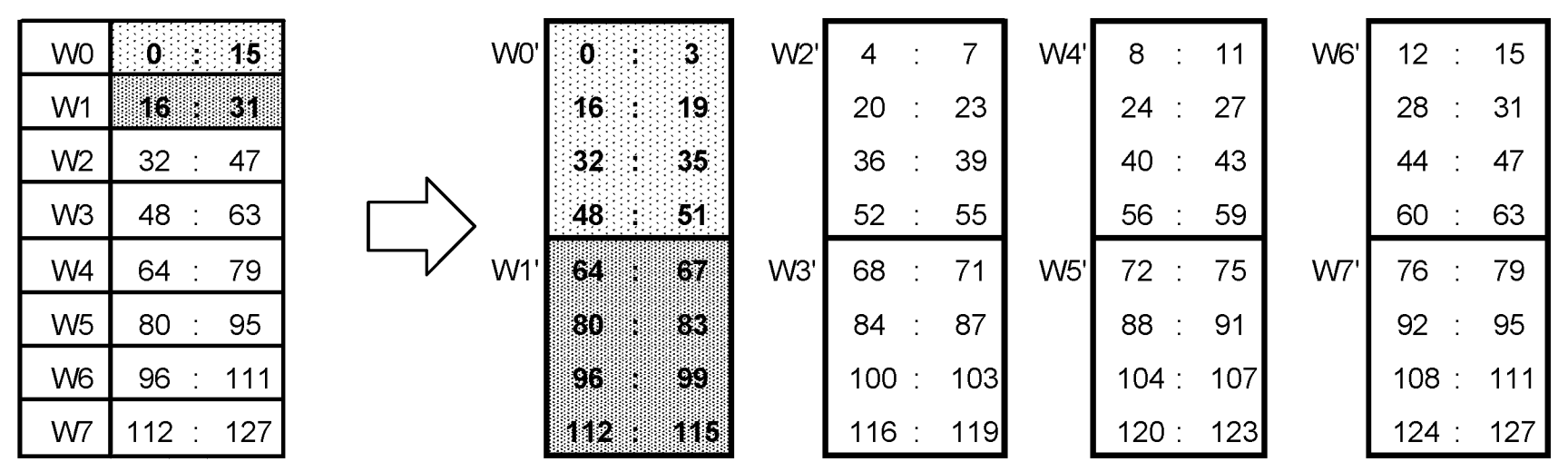

FIG. 22 is a schematic representation of the reshuffling of the compressed data bits to be in logical order. As shown at bottom in FIG. 21, the compressed data is formed into 16-bit words in the XDL tiers that is transferred from the transfer latches of the cache buffer 1507 to the DP block 1515; however, due to the manipulations illustrated with respect to FIGS. 18-21, as part of the data output process the data bits can be reshuffled to move them into logical user column address order. In the example embodiment, where groups of 4 bits of the compressed data are shifted as illustrated in FIG. 21 to form the 16 bit words in the XDL tiers, these 4 bits units are rearranged using the map logic in the DP block 1515. FIG. 22 illustrates an embodiment where data is received from the global data bus 1511 in an 8×16-bit word parallel format, where word W0 has bits 0-15, W1 has bits 16-31, and so on through to W7 of bits 112-127, as illustrated at left. These words W0-W7 are broken into sets of 4 bits to form words W0'-W7', with the first 4 bits of each of W0-W3 going into W0', the next 4 bits of each of W0-W1 going into W2', the third 4 bits of each of W0-W1 going into W4', and the last 4 bits of each of W0-W1 going into W6'. Words W4-W7 are similarly rearranged into W1', W3', W5', and W7'. These words W0'-W7' can then be output in this rearranged word order in (byte wide) serial format over the IO pads 1517.

Relative to FIGS. 2A and 2B, DP block 1515 including the map logic can be part of interface 268 under control of system control logic 260. Depending on the embodiment, additional latches or FIFOs along with multiplexing circuitry may included in the DP block 1515 to facilitate the reshuffling of the compressed data into logical user column address order.

Figure 23:
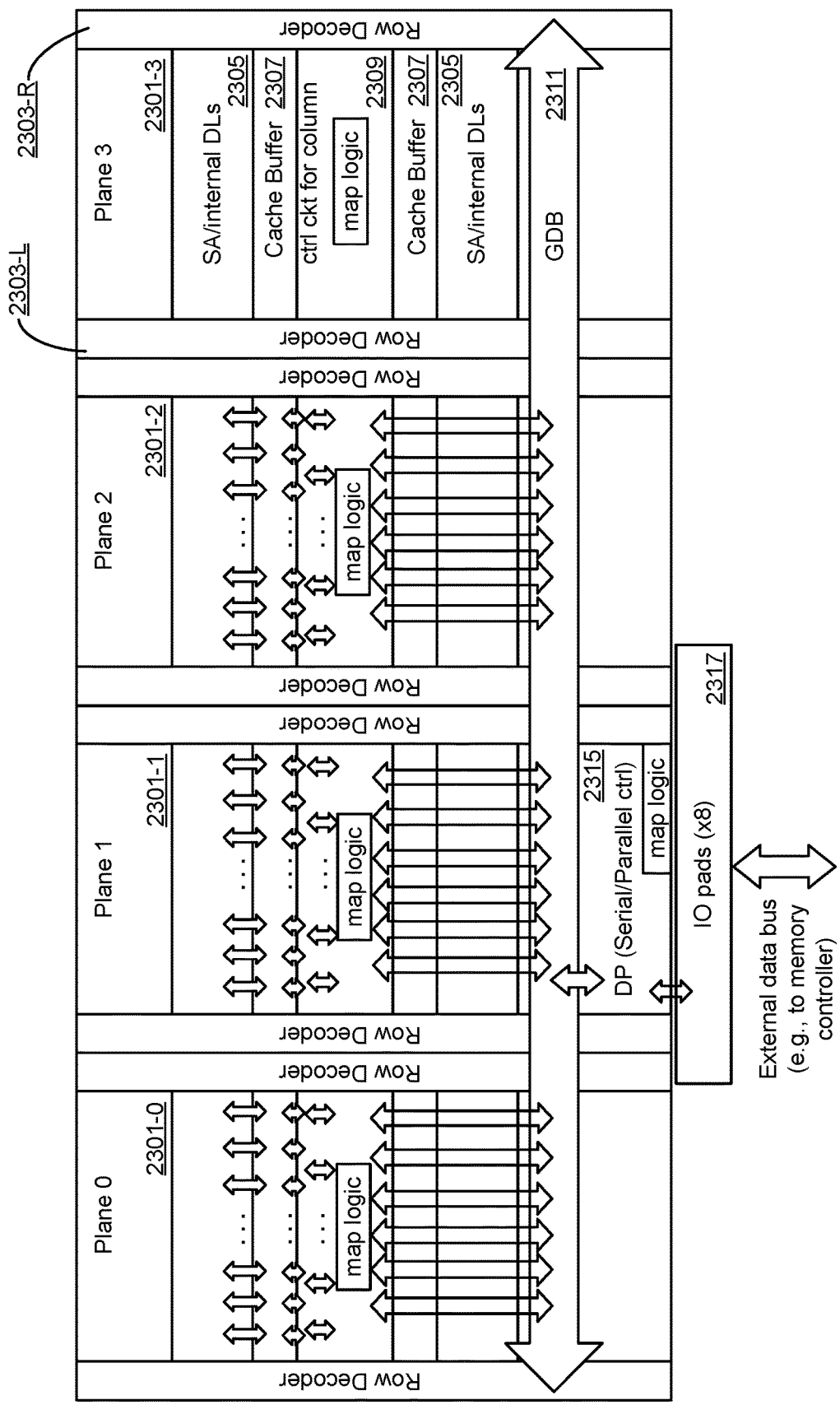
FIG. 23 is a block diagram of an alternate embodiment for some of the control circuit elements of a memory device including a soft bit compression element.

FIG. 23 is a block diagram of an alternate embodiment for some of the control circuit elements of a memory device including a soft bit compression element. The embodiment of FIG. 23 repeats the elements of FIG. 15, which are similarly number (i.e., Cache Buffer 1505 is now 2305, global data bus GDB 1511 is now 2311, and so on), but now also includes map logic within the control circuit for columns 2309 in addition to, or alternatively to, the map logic in the DP block 1515. Depending on the implementation of the of the control circuitry of FIG. 15 or 23, it may be easier or more efficient to reshuffle the compressed data bits to logical order completely or partially in the column control circuit for columns 2309, rather than in the DP block 1515 or 2315.

For example, due to constrains on timing, available area for circuitry, or the topology of the circuitry, it may be difficult to fully reshuffle the compressed data bits to user logical order with the DP block 2315. To fully reshuffle the compressed data bits, in one set of embodiments the compressed data bits are partially resorted within map logic of the control circuit for columns 2309 prior to being transferred onto the global data bus 2311, transferred to the DP block 2315, and then further reshuffled to be fully in user logical order in the map logic of the DP block 2315 before being transferred off of the device through the IO pads 2317. Under this arrangement, the process illustrated by FIGS. 18-21 of compressing the read soft bit or other data can be the same up until the compressed data are consolidated or compacted at the end of FIG. 21. However, rather than transferring the compacted, compressed data at this point over the global data bus 2311 at this point and performing the reshuffling process only as illustrated in FIG. 22 in the DP block 2315, the reshuffling can be performed as illustrated with respect to FIGS. 24A and 24B.

Figure 24B:

FIGS. 24A and 24B are a schematic representation of one alternate embodiment of the reshuffling of the compressed data bits to be in logical order using the embodiment of FIG. 23. The steps illustrated in FIGS. 24A and 24B can start with the compressed data bit compacted in the XDL latches of the cache buffer 2307 as illustrated at the bottom of FIG. 21. FIG. 21 illustrates the data compacted into three XDL tiers, such as W0<3:0> for word zero, leaving the other XDL tiers open for other compacted word of data. In this N=4 example, three other data compactions can be stored. For example, if a read page (e.g., word line) corresponding to M such words, then (in the N=4 example) the word line can be split into four divisions of M/4 words, so that W0 in the first XDL tiers <3:0>, W(M/4) is in the XDL tiers <7:4>, W(2M/4) is in the XDL tiers <11:8>, and W(3M/4) is in the XDL tiers <15:12>, with this next word of each of these divisions grouped with W1 and so on. This is illustrated at the top of FIG. 24A for an example of (M/4)=288. Consequently, as seen in each of the rows, the different bits in a compressed word can include bits from words that, prior to compression, are from widely separated logical words, so that, for example, W1 in the XDL latches of the cache buffer 2307 can have compressed data bits from logical words W1, W289, W577, and W864. To sort this out, a first step in one embodiment for the reshuffling can occur when the compressed and compacted data bits are transferred from the XBUSs of the cache buffer 2307 onto an IOBUS of the control circuitry for columns 2309, as illustrated in the bottom part of FIG. 24A.

In the example of FIG. 24A, the IO bus within the control circuitry for columns 2309 has two 16-bit wide busses, IOBUS A and IOBUS B. In this first stage of reshuffling, the compressed and compacted words of data are rearranged by the mapping logic of the control circuitry for columns 2309 such that logical word addresses for a given division are grouped together, where one embodiment for placing the compressed data for the first 64 logical words is shown for the pair of IO bus values 0-8 for IOBUS A and IOBUS B. In this example, the compressed bits for logical words W0, W16, W32, and W48 are on IOBUS0A, with the logical word values incrementing by 1 on IOBUS1A and so on, with the IOBUS B values incremented by 8 logical words. The specifics of the IO bus width, and number of busses is implementation specific and depend on the on the degree of parallelism used at the different stages of the data transfer process.

By use of multiplexing circuitry within the control circuitry for columns 2309, the compressed data bits can be further reshuffled from the arrangement at the bottom of FIG. 24A to the words of the arrangement at the top of FIG. 24B. In one embodiment, in the partially reshuffled form, the compressed data bits are transferred over global data bus 2311 to the DP block 2315, where multiplexing circuitry within the mapping logic can then complete the reordering to be in order of the order logical addresses as illustrated in the lower part of FIG. 24B. Within the DP block 2315, multiplexing circuitry within the mapping logic the reshuffling of the compressed data can then be completed, similarly to the process described with respect to FIG. 22, and then the reshuffled compressed data can be transferred out over the IO pads 2317.

Figure 25:
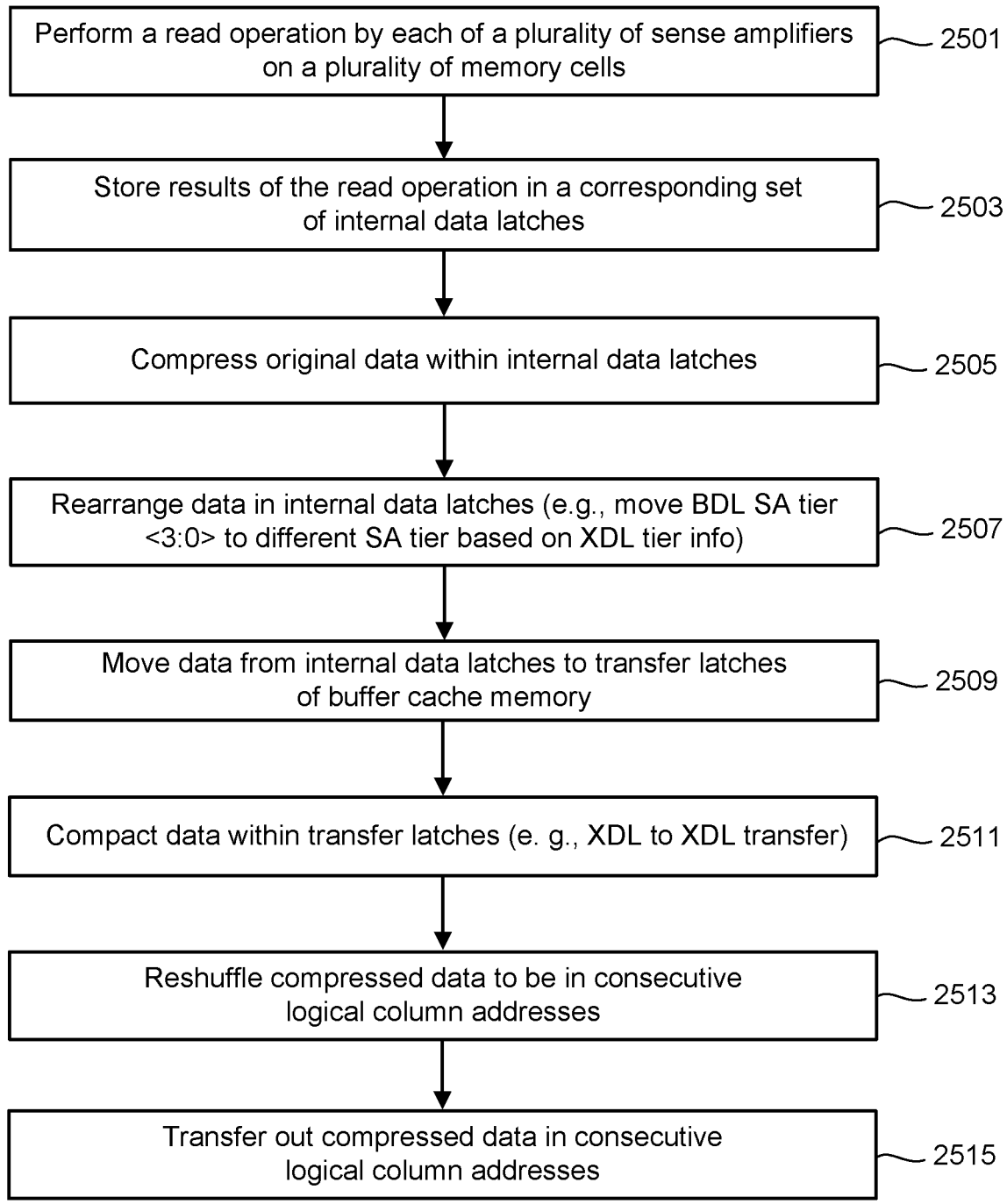
FIG. 25 is a flowchart for an embodiment of performing data compression with the data latches associated with the sense amplifiers of a non-volatile memory device.

FIG. 25 is a flowchart for an embodiment of performing data compression within the data latches associated with the sense amplifiers of a non-volatile memory device. Starting at step 2501, a read operation is performed using the sense amplifier circuits on multiple memory cells, with the results of the read operation being stored in the internal data latches corresponding to the sense amplifiers at step 2503. Referring to FIG. 15, these steps are performed in the SA/internal DLs 1505, where the internal data latches (ADL, BDL, . . . ) can be arranged into the tier structure illustrated with respect to FIGS. 17A and 17B. With respect to the FIGS. 2A and 2B, the read process is performed as described above using the control circuitry of row control circuitry 220, column control circuitry 210, and system control logic 260. In the main example here, the data is soft bit data determined in an efficient soft sense operation with respect to FIGS. 10-14. More generally, the compression process can be applied to the usual type of soft bit data as described with respect to FIGS. 8-9B or other data. In any case, in the example described above, at the end of step 2503 the soft bit or other read data is stored into the ADL latches.

The compression process begins at step 2505, with the data compressed within sets of internal data latches, such as is illustrated in FIG. 18 or 19 where the data in ADL<15:0> is compressed and stored into BDL<3:0> for each of the XDL tiers. Referring back to FIG. 3, this process and the subsequent data latch manipulations can be controlled by the processor 330 and system logic 260. Once compressed, at step 2507 the data can be rearranged within the internal data latches as illustrated in FIG. 20 and then copied from the internal data latches to the external data latches XDL of the cache buffer 1507 at step 2509. Depending on the embodiment, a number of variations are possible, such as combing step 2505 and 2507, using different ones of the latches, different compression algorithms, or differing rearrangements of the compressed data, with FIGS. 18-22 being just one example. In any case, the soft bit or other data can be compressed within the internal data latches prior to transferring the compressed data out to the cache buffer 1507.

Once the compressed data is stored in the transfer latches of the cache buffer 1507, at step 2511 the compressed data can be consolidated, such as in the compression of FIG. 21, to more efficiently be transferred over the global data bus 1511 to the input-output interface elements of DP block 1515 and IO pads 1517. The compressed data bits can be reshuffled to user logical order at step 2513 and then transferred out over an external data bus at step 2515. As described above with respect to FIGS. 15 and 22, the reshuffling can be performed in the map logic of the DP block 1515; within the map logic of the control circuitry of the control circuit for the columns 2309; or a combination of these, as described with respect to FIGS. 23, 24A, and 24B. In the case of soft bit data, this can include a transfer to an ECC engine (e.g., 158 of FIG. 1). FIG. 22 illustrates one example of reshuffling of the compressed data for the particular re-arrangements of the preceding steps of the example embodiment, but in other cases the re-arrangement could be different or not performed before transfer, with reshuffling done later if needed.

According to a first set of aspects, a non-volatile memory device includes a control circuit configured to a plurality of bit lines each connected to a corresponding plurality of memory cells. The control circuit includes: a plurality of sense amplifiers each configured to read data from the memory cells connected to a corresponding one or more bit lines; a plurality of sets of internal data latches, each set of internal data latches configured to store data associated with a corresponding one of the sense amplifiers; and an input-output interface configured to provide data to an external data bus. The control circuit is configured to: perform a read operation by each of the sense amplifiers on a plurality of memory cells; store results of the read operation by each of the sense amplifiers in the corresponding set of internal data latches; compress the results of the read operation by each of the sense amplifiers within the corresponding set of internal data latches; and transfer the compressed results of the read operation over the input-output interface to the external data bus.

In further aspects, a method includes: performing a read operation by each of a plurality of sense amplifiers on a plurality of memory cells; storing results of the read operation by each of the sense amplifiers in a corresponding set of internal data latches; performing, within the corresponding set of internal data latches, a data compression operation the results of the read operations by each of the sense amplifiers; and transferring the compressed results of the read operations from the sets of internal data latches to an input-output interface.

Additional aspects include a non-volatile memory device, comprising: a plurality of bit lines each connected to a corresponding plurality of non-volatile memory cells; a plurality of sense amplifier circuits each configured to read data from memory connected to a corresponding one or more bit lines; a plurality of sets of internal data latches, each set of internal data latches configured to store data associated with a corresponding one of the sense amplifiers; a cache buffer comprising a plurality of sets of transfer data latches each corresponding to one of the sets of internal data latches; an input-output interface configured to provide data to an external data bus; and one or more control circuits connected to the sense amplifier circuits, the sets of internal data latches, the cache buffer, and the input-output interface. The one or more control circuits are configured to: perform a read operation by each of the plurality of sense amplifiers on a plurality of the corresponding memory cells; store results of the read operation by each of the sense amplifiers in the corresponding set of internal data latches; compress, within the corresponding set of internal data latches, the results of the read operation by each of the sense amplifiers; transfer the compressed results of the read operation from each of the sets of internal data latches to the corresponding set of transfer data latches; and transfer the compressed results of the read operation from the sets of transfer latches data latches to the input-output interface.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   a control circuit configured to connect to a plurality of bit lines each connected to a corresponding plurality of memory cells, the control circuit comprising:
   a plurality of sense amplifiers each configured to read data from the memory cells connected to a corresponding one or more bit lines;
   a plurality of sets of internal data latches, each set of internal data latches configured to store data associated with a corresponding one of the sense amplifiers;
   a cache buffer comprising a plurality of sets of transfer data latches each corresponding to one of the sets of internal data latches; and
   an input-output interface configured to provide data to an external data bus, the control circuit configured to:
   perform a read operation by each of the sense amplifiers on a plurality of memory cells;
   store results of the read operation by each of the sense amplifiers in the corresponding set of internal data latches;
   compress the results of the read operation by each of the sense amplifiers within the corresponding set of internal data latches;
   transfer the compressed results of the read operation from each of the set of internal data latches to a corresponding set of transfer data latches;
   compact the compressed results of the read operation from the sets of transfer data latches into a smaller number of the sets of transfer latches; and
   transfer the compacted compressed results of the read operation over the input-output interface to the external data bus.

2. The non-volatile memory device of claim 1, wherein the control circuit is formed on a control die, the non-volatile memory device further comprising:
   a memory die including the plurality of bit lines and corresponding pluralities of non-volatile memory cells, the memory die formed separately from and bonded to the control die.

3. The non-volatile memory device of claim 1, wherein the results of the read operation are soft bit data values.

4. The non-volatile memory device of claim 3, wherein the control circuit is further configured to:
   perform a hard bit read operation by each of the sense amplifiers on the plurality of memory cells to determine a hard bit value for each of the plurality of memory cells indicating whether the memory cell is either reliably in a first data state or unreliability in a second data state, wherein each of the soft bit data values correspond to one of the hard bit values and indicate the reliability value of memory cells determined to be in the second data state, but not for memory cells determined to be in the first data state.

5. The non-volatile memory device of claim 3, wherein the control circuit is further configured to:
   perform a hard bit read operation by each of the sense amplifiers on the plurality of memory cells to determine a hard bit value for each of the plurality of memory cells;
   transfer the hard bit values and the corresponding soft bit data values from the input-output interface to an error correction code engine, wherein the soft bit data values are transferred in compacted compressed form and the hard bits are transferred with being compacted or compressed.

6. The non-volatile memory device of claim 1, wherein the control circuit is further configured to:
   re-order bits of the compressed results of the read operation prior to transferring the compressed results of the read operation to the external data bus.

7. The non-volatile memory device of claim 1, wherein the control circuit is further configured to:
   receive the compressed results of the read operation at the input-output interface in a parallel format; and
   convert the compressed results of the read operation prior to transferring the compressed results of the read operation to the external data bus.

8. The non-volatile memory device of claim 1, wherein, to compress the results of the read operation by each of the sense amplifiers within the corresponding set of internal data latches, the control circuit is further configured to:
perform logical combinations of multiple ones of the results of the read operation by each of the sense amplifiers.

9. The non-volatile memory device of claim 1, further comprising:
an array of non-volatile memory cells, including the plurality bit lines each corresponding pluralities of memory cells, formed according to a three dimensional NAND architecture.

10. A method, comprising:
performing a read operation by each of a plurality of sense amplifiers on a plurality of memory cells;
storing results of the read operation by each of the sense amplifiers in a corresponding set of internal data latches;
performing, within the corresponding set of internal data latches, a data compression operation of the results of the read operations by each of the sense amplifiers;
transferring the compressed results of the read operation from each of the set of internal data latches to a corresponding set of transfer data latches;
compacting the compressed results of the read operation from the sets of transfer data latches into a smaller number of the sets of transfer latches; and
transferring the compacted compressed results of the read operations from the sets of internal data latches to an input-output interface.

11. The method of claim 10, further comprising
re-ordering bits of the compressed results of the read operation in the input-output interface.

12. The method of claim 11, further comprising
receiving the compressed results of the read operation at the input-output interface in a parallel format; and
converting the compressed results of the read operation to a series format prior to transferring the compressed results of the read operation to the external data bus.

13. The method of claim 10, wherein the results of the read operation are soft bit data values.

14. The method of claim 13, further comprising:
performing a hard bit read operation by each of the sense amplifiers on the plurality of memory cells to determine a hard bit value for each of the plurality of memory cells indicating whether the memory cell is either reliably in a first data state or unreliability in a second data state, wherein each of the soft bit data values correspond to one of the hard bit values and indicate a reliability value of memory cells determined to be in the second data state, but not for memory cells determined to be in the first data state.

15. The method of claim 14, further comprising:
transferring the hard bit values and the corresponding soft bit data values from the input- output interface to an error correction code engine.

16. The method of claim 15, wherein the soft bit data values are transferred in compacted compressed form and the hard bits are transferred with being compacted or compressed.

17. A non-volatile memory device, comprising:
a plurality of bit lines each connected to a corresponding plurality of non-volatile memory cells;
a plurality of sense amplifier circuits each configured to read data from memory connected to a corresponding one or more bit lines;
a plurality of sets of internal data latches, each set of internal data latches configured to store data associated with a corresponding one of the sense amplifiers;
a cache buffer comprising a plurality of sets of transfer data latches each corresponding to one of the sets of internal data latches;
an input-output interface configured to provide data to an external data bus; and
one or more control circuits connected to the sense amplifier circuits, the sets of internal data latches, the cache buffer, and the input-output interface, the one or more control circuits configured to:
perform a read operation by each of the plurality of sense amplifiers on a plurality of the corresponding memory cells;
store results of the read operation by each of the sense amplifiers in the corresponding set of internal data latches;
compress, within the corresponding set of internal data latches, the results of the read operation by each of the sense amplifiers;
transfer the compressed results of the read operation from each of the sets of internal data latches to the corresponding set of transfer data latches;
compact the compressed results of the read operation from the sets of transfer data latches into a smaller number of the sets of transfer latches; and
transfer the compacted compressed results of the read operation from the sets of transfer latches data latches to the input-output interface.

18. The non-volatile memory device of claim 17, wherein the results of the read operation are soft bit data values.

19. The non-volatile memory device of claim 18, wherein the one or more control circuits are further configured to:
perform a hard bit read operation by each of the sense amplifiers on the plurality of memory cells to determine a hard bit value for each of the corresponding of memory cells;
transfer the hard bit values and the corresponding soft bit data values from the input-output interface to an error correction code engine, wherein the soft bit data values are transferred in compacted compressed form and the hard bits are transferred with being compacted or compressed.

20. The non-volatile memory device of claim 17, wherein the non-volatile memory device includes:
a control die on which the one or more control circuits are formed; and
a memory die including the plurality of bit lines and corresponding pluralities of non-volatile memory cells, the memory die formed separately from and bonded to the control die.

* * * * *